United States Patent
Kim et al.

(10) Patent No.: US 11,746,290 B2
(45) Date of Patent: *Sep. 5, 2023

(54) NANOCRYSTAL PARTICLES AND PROCESSES FOR SYNTHESIZING THE SAME

(71) Applicant: SAMSUNG ELECTRONICS CO., LTD., Suwon-si (KR)

(72) Inventors: Hyunki Kim, Suwon-si (KR); Shin Ae Jun, Seongnam-si (KR); Eun Joo Jang, Suwon-si (KR); Yongwook Kim, Hwaseong-si (KR); Tae Gon Kim, Hwaseong-si (KR); Yuho Won, Seoul (KR); Taekhoon Kim, Hwaseong-si (KR); Hyo Sook Jang, Suwon-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 888 days.

This patent is subject to a terminal disclaimer.

(21) Appl. No.: 15/830,134

(22) Filed: Dec. 4, 2017

(65) Prior Publication Data

US 2018/0094190 A1   Apr. 5, 2018

Related U.S. Application Data

(63) Continuation-in-part of application No. 14/494,673, filed on Sep. 24, 2014, now Pat. No. 9,834,724.

(30) Foreign Application Priority Data

Sep. 26, 2013 (KR) .................. 10-2013-0114601
Sep. 18, 2014 (KR) .................. 10-2014-0124542

(51) Int. Cl.
| | |
|---|---|
| *C09K 11/61* | (2006.01) |
| *C09K 11/72* | (2006.01) |
| *C09K 11/70* | (2006.01) |
| *C09K 11/56* | (2006.01) |
| *C09K 11/62* | (2006.01) |
| *C09K 11/88* | (2006.01) |
| *H01L 33/50* | (2010.01) |
| *H01L 29/06* | (2006.01) |
| *H01L 29/22* | (2006.01) |
| *C09K 11/02* | (2006.01) |
| *B82Y 40/00* | (2011.01) |
| *B82Y 20/00* | (2011.01) |
| *B82Y 30/00* | (2011.01) |

(52) U.S. Cl.
CPC .......... *C09K 11/883* (2013.01); *C09K 11/025* (2013.01); *C09K 11/565* (2013.01); *C09K 11/61* (2013.01); *C09K 11/612* (2013.01); *C09K 11/70* (2013.01); *C09K 11/705* (2013.01); *C09K 11/72* (2013.01); *C09K 11/722* (2013.01); *C09K 11/88* (2013.01); *H01L 29/0665* (2013.01); *H01L 29/22* (2013.01); *B82Y 20/00* (2013.01); *B82Y 30/00* (2013.01); *B82Y 40/00* (2013.01); *H01L 33/502* (2013.01); *Y10S 977/774* (2013.01); *Y10S 977/818* (2013.01); *Y10S 977/824* (2013.01); *Y10S 977/825* (2013.01); *Y10S 977/892* (2013.01); *Y10S 977/896* (2013.01); *Y10S 977/95* (2013.01)

(58) Field of Classification Search
CPC ......... B82Y 20/00; B82Y 40/00; B82Y 15/00; B82Y 99/00; C09K 11/02; C09K 11/70; C09K 11/883; C09K 11/565; C09K 11/025; C09K 11/88; C09K 11/562; C09K 11/61; C09K 11/621; C09K 11/612; C09K 11/623; C09K 11/705; C09K 11/08; C09K 11/54; C09K 11/572; C09K 11/574; C09K 11/584; C09K 11/62; C09K 11/64; C09K 11/65; C09K 11/881; C01P 2004/80; C01P 2004/64; C01P 2004/84; C01P 2004/62; C01B 25/087; C01B 25/08; C01B 25/082; C01B 21/0632; C01B 19/007; H01L 33/502; H01L 21/02601
USPC ........ 252/301.6 S, 301.6 R, 301.36, 301.4 S, 252/301.6 F, 301.6 P, 301.4 F, 301.4 H, 252/301.4 P See application file for complete search history.

(56) References Cited

U.S. PATENT DOCUMENTS

| | | |
|---|---|---|
| 6,322,901 B1 | 11/2001 | Bawendi et al. |
| 6,429,318 B1 | 8/2002 | Mitzi |

(Continued)

FOREIGN PATENT DOCUMENTS

| | | |
|---|---|---|
| CN | 101194372 A | 6/2008 |
| CN | 101336479 A | 12/2008 |

(Continued)

OTHER PUBLICATIONS

Li et al., "Luminescence properties of Br-doped ZnS nanoparticles synthesized by a low temperature solid-state reaction method", Ceramics International, 39, 5, 2012, pp. 1-5.

(Continued)

*Primary Examiner* — Matthew E. Hoban
*Assistant Examiner* — Lynne Edmondson
(74) *Attorney, Agent, or Firm* — CANTOR COLBURN LLP

(57) ABSTRACT

A nanocrystal particle including at least one semiconductor material and at least one halogen element, the nanocrystal particle including: a core comprising a first semiconductor nanocrystal; and a shell surrounding the core and comprising a crystalline or amorphous material, wherein the halogen element is present as being doped therein or as a metal halide.

21 Claims, 13 Drawing Sheets

(56) References Cited

U.S. PATENT DOCUMENTS

| | | | |
|---|---|---|---|
| 6,861,155 B2 | 3/2005 | Bawendi et al. | |
| 7,105,051 B2 | 9/2006 | Peng et al. | |
| 7,199,393 B2 | 4/2007 | Park et al. | |
| 7,427,523 B2 | 9/2008 | Boardman et al. | |
| 7,476,487 B2 | 1/2009 | Park et al. | |
| 7,641,815 B2 | 1/2010 | Varadarajan et al. | |
| 7,963,119 B2 | 6/2011 | Campbell | |
| 7,964,278 B2 | 6/2011 | Banin et al. | |
| 8,035,772 B2 | 10/2011 | Kim et al. | |
| 8,174,181 B2 | 5/2012 | Bawendi et al. | |
| 8,252,205 B2 | 8/2012 | Jun et al. | |
| 8,343,576 B2 | 1/2013 | Banin et al. | |
| 8,362,684 B2 | 1/2013 | Bawendi et al. | |
| 8,436,964 B2 | 5/2013 | Kim et al. | |
| 8,529,797 B2 | 9/2013 | Shum | |
| 8,545,736 B2 | 10/2013 | Jun et al. | |
| 8,758,864 B2 | 6/2014 | Park et al. | |
| 8,784,685 B2 | 7/2014 | Lifshitz et al. | |
| 8,963,119 B2 | 2/2015 | Jang et al. | |
| 9,005,486 B2 | 4/2015 | Brinkman et al. | |
| 9,082,982 B2 | 7/2015 | Jun et al. | |
| 9,082,992 B2 | 7/2015 | Guo et al. | |
| 9,284,484 B2 | 3/2016 | Jang et al. | |
| 9,517,936 B2 | 12/2016 | Jeong et al. | |
| 9,834,724 B2 * | 12/2017 | Kim | C09K 11/61 |
| 10,074,770 B2 * | 9/2018 | Park | H01L 33/28 |
| 10,141,117 B2 | 11/2018 | Vak | |
| 10,179,876 B2 * | 1/2019 | Jun | C09K 11/70 |
| 10,388,897 B2 | 8/2019 | Snaith et al. | |
| 10,559,712 B2 * | 2/2020 | Park | C09K 11/615 |
| 10,585,228 B2 | 3/2020 | Kim et al. | |
| 10,597,580 B2 | 3/2020 | Min et al. | |
| 10,808,174 B2 * | 10/2020 | Park | G02B 5/223 |
| 11,312,905 B2 * | 4/2022 | Newmeyer | C09K 11/70 |
| 2004/0126072 A1 | 7/2004 | Hoon Lee et al. | |
| 2005/0266246 A1 | 12/2005 | Reiss et al. | |
| 2005/0287691 A1 * | 12/2005 | Chen | B82Y 30/00 257/E21.464 |
| 2007/0125984 A1 | 6/2007 | Tian et al. | |
| 2007/0194279 A1 * | 8/2007 | Peng | C09K 11/584 977/773 |
| 2008/0014463 A1 | 1/2008 | Varadarajan et al. | |
| 2008/0138514 A1 | 6/2008 | Jang et al. | |
| 2008/0290797 A1 | 11/2008 | Park et al. | |
| 2009/0230382 A1 | 9/2009 | Banin | B82Y 20/00 257/14 |
| 2010/0006775 A1 | 1/2010 | Gibson | |
| 2010/0110728 A1 | 5/2010 | Dubrow et al. | |
| 2010/0159249 A1 | 6/2010 | Jang et al. | |
| 2010/0233094 A1 | 9/2010 | Chung et al. | |
| 2010/0234209 A1 | 9/2010 | Furukawa | B01J 35/004 502/100 |
| 2010/0283072 A1 | 11/2010 | Kazlas et al. | |
| 2011/0006281 A1 | 1/2011 | Jang et al. | |
| 2011/0220844 A1 | 9/2011 | Tulsky et al. | |
| 2012/0113671 A1 | 5/2012 | Sadasivan et al. | |
| 2012/0113672 A1 | 5/2012 | Dubrow et al. | |
| 2012/0175588 A1 * | 7/2012 | Qiao | C09K 11/883 977/774 |
| 2012/0305918 A1 | 12/2012 | Shum | |
| 2013/0129632 A1 | 5/2013 | Leong et al. | |
| 2013/0207073 A1 | 8/2013 | Bawendi et al. | |
| 2014/0001405 A1 | 1/2014 | Guo et al. | |
| 2014/0027711 A1 | 1/2014 | Breen et al. | |
| 2014/0071381 A1 | 3/2014 | Jang et al. | |
| 2014/0326921 A1 | 11/2014 | Lu et al. | |
| 2015/0021548 A1 | 1/2015 | Liu et al. | |
| 2015/0083969 A1 | 3/2015 | Kim et al. | |
| 2015/0194577 A1 | 7/2015 | Glarvey et al. | |
| 2015/0203747 A1 | 7/2015 | Haley et al. | |
| 2015/0218442 A1 | 8/2015 | Jun et al. | |
| 2015/0218444 A1 | 8/2015 | Kang et al. | |
| 2015/0291422 A1 | 10/2015 | Jeong et al. | |
| 2018/0083213 A1 | 3/2018 | Snaith et al. | |
| 2018/0094190 A1 | 4/2018 | Kim et al. | |
| 2018/0148638 A1 | 5/2018 | Ahn et al. | |
| 2019/0112527 A1 | 4/2019 | Moriyama et al. | |
| 2019/0169500 A1 | 6/2019 | Kim et al. | |
| 2019/0348622 A1 | 11/2019 | Snaith et al. | |

FOREIGN PATENT DOCUMENTS

| | | | |
|---|---|---|---|
| CN | 101959973 A | 1/2011 | |
| CN | 103474575 A | 12/2013 | |
| CN | 104512860 A | 4/2015 | |
| CN | 104662625 A | 5/2015 | |
| CN | 104818019 A | 8/2015 | |
| CN | 104974759 A | 10/2015 | |
| EP | 2853578 A1 | 4/2015 | |
| EP | 2905321 A1 | 8/2015 | |
| KR | 1020050038120 A | 4/2005 | |
| KR | 100871961 B1 | 11/2008 | |
| KR | 1020100071696 A | 6/2010 | |
| KR | 1020110004775 A | 1/2011 | |
| KR | 101165100 B1 | 7/2012 | |
| KR | 1020120131945 A | 12/2012 | |
| KR | 1020130044071 A | 5/2013 | |
| KR | 1020140032811 A | 3/2014 | |
| KR | 101460155 B1 | 11/2014 | |
| KR | 1020150032655 A | 3/2015 | |
| KR | 101517094 B1 | 4/2015 | |
| KR | 10-1525524 B1 | 5/2015 | |
| KR | 101525524 B1 | 5/2015 | |
| KR | 101525525 B1 | 5/2015 | |
| KR | 101544317 B1 | 8/2015 | |
| WO | 9950916 A1 | 10/1999 | |
| WO | 01/25316 A1 | 4/2001 | |
| WO | 2006/116337 A2 | 11/2006 | |
| WO | 2012/111009 A2 | 8/2012 | |
| WO | 2012/112120 A1 | 8/2012 | |
| WO | WO 2012111009 A2 | 8/2012 | B01J 13/0039 |
| WO | 2013171517 A1 | 11/2013 | |
| WO | 2013171518 A1 | 11/2013 | |
| WO | 2015002995 A1 | 1/2015 | |
| WO | 2015127494 A1 | 9/2015 | |

OTHER PUBLICATIONS

Li et al., "Synthesis and photoluminescence properties of Cl-dopeed ZnS nanoparticles prepared by a solid-state reaction", Materials Science and Engineering B 178, 2013, pp. 917-922.

Wikipedia, List of semiconductor materials (https://en.wikipedia.org/wiki/List_of_semiconductor_materials), printed Feb. 4, 2016, 19 pages.

Chinese Office Action for Chinese Patent Application No. 201410495213.6 dated Feb. 20, 2017.

Adam et al., "The effect of nanocrystal surface structure on the luminescence properties: Photoemission study of HF-etched InP nanocrystals", The Journal of chemical Physics, 123, 2005, 084706-1-084706-10.

Dung et al., "InP Quantum Dot-Organosilicon Nanocomposites", Bull Korean Chem. Soc. 2012, vol. 33, No. 5, pp. 1491-1501.

Kim et al., "Large-Scale Synthesis of InPZnS Alloy Quantum Dots with Dodecanethiol as a Composition Controller", The Journal of Physical Chemistry. Lett., 2012, 3, pp. 214-218.

Li et al., "One-pot Synthesis of Highly Luminescent InP/ZnS nanocrystals without Precursor Injection", J. Am. Chem. Soc., 2008, 130, pp. 11588-11589.

Lovingood et al., "Microwave Induced In-Situ Active Ion Etching of Growing InP Nanocrystals", Nano Letters, vol. 8, No. 10, 2008, pp. 3394-3397.

Mushonga et al., "Indium Phosphide-Based Semiconductor Nanocrystals and Their Applications", Journal of Nanomaterials, vol. 2012, Oct. 2011, pp. 1-11.

Mutlugun et al., "Large-Area (over 50 cm × 50 cm) Freestanding Films of colloidal InP/ZnS Quantum Dots", American Chemical Society, Nano Lett., 2012, 12, pp. 3986-3993.

Tamang et al., "Aqueous Phase Transfer of InP/ZnS nanocrystals Conserving Fluorescence and High Colloidal Stability", ACSNANO, vol. 5, No. 12, 2011, pp. 9392-9402.

(56) References Cited

OTHER PUBLICATIONS

Thuy et al., "Comparative photoluminescence study of close-packed and colloidal InP/ZnS quantum dots", Applied Physics Letters, 96, 2010, pp. 073102-1-073102-3.
Xu et al., "Rapid synthesis of highly luminescent InP and InP/ZnS nanocrystals*", Journal of Materials Chemistry, 18, k 2008, pp. 2653-2656.
Arias-Ceron J. S. et al., "Semiconductor Nanocrystals of InP@ZnS: Synthesis and Characterization", Superficies y Vacio, 25(2), 2012, pp. 134-138.
Haubold et al., "Strongly Luminescent InP/ZnS Core-Shell Nanoparticles", CHEMPHYSCHEM, No. 5, 2001, pp. 331-334.
Kim et al., "Design and Synthesis of Photostable Multi-shell Cd-free Nanocrystal Quantum dots for LED Applications", Electronic Supplementary Material (ESI) for Journal of Materials Chemistry, 2012, pp. 1-3.
Mushonga et al., Indium Phosphide-Based Semiconductor Nanocrystals and Their Applications, Journal of Nanomaterials, vol. 2012, 2012, pp. 1-11.
Chen et al., "Photoluminescence spectra of ZnS:X (X=F and I) nanoparticles synthesized via a solid-state reaction", Optical Materials, vol. 36, No. 6, pp. 1007-1012.
Extended European Search Report for European Patent Application No. 14185782.1 dated Feb. 18, 2015.
Manzoor et al., "Synthesis and photoluminescent properties of ZnS nanocrystals doped with copper and halogen", Materials Chemistry and Physics, vol. 82, 2003, pp. 718-725.
Marsh et al., "Impurity Induced Disordering of GaInAs Quantum Wells with Barriers of AlGaInAs or of GaInAsP", Indium Phosphide and Related Materials, 1991, Third International Conference, Apr. 8, 1991, pp. 592-595.
Akkerman et al., "Tuning the Optical Properties of Cesium Lead Halide Perovskite Nanocrystals by Anion Exhange Reactions", pp. 6, PUblication date Jul. 27, 2015, ACS PUblications, Journal of the American Chemical Society, vol. 137, pp. 10276-10281.
Alexander H. IP et al., Hybrid passivated colloidal quantum dot solids, 2012, pp. 577-582, vol. 7, Nature nanotechnology.
Chinese Office Action for Chinese Patent Application No. 201611195503.4 dated Nov. 25, 2020.
Christopher H. Hendon et al., "Assessment of polyanion (BF4—and PF6-substitutions in hybrid halide perovskites," Journal of Materials Chemistry A, Oct. 22, 2014, pp. 1-4.
Declaration by Maksym Kovalenko and Frnziska Krieg, Submitted in the Grounds for Opposition, dated May 15, 2019 of corresponding application EP 3168278.
European Office Action for European Patent Application No. 18179312.6 dated Mar. 12, 2020.
European Search Report for European Patent Application No. 16196124.8 dated Apr. 18, 2017.
European Search Report for European Patent Application No. 16205175.9 dated Mar. 28, 2017.
European Search Report for European Patent Application No. 18179312.6 dated Jun. 27, 2019.
Fan Zuo., "Binary-Metal Perovskites Toward High-Performance Planar-Heterojunction Hybrid Solar Cells," Advanced Materials, Aug. 14, 2014, pp. 6454-6460, vol. 26, Issue 37.
Jun Pan et al., "Air-Stable Surface-Passivated Perovskite Quantum Dots for Ultra-Robust, Single- and Two-Photon-Induced Amplified Spontaneous Emission," J. Phys. Chem. Lett. 2015, Dec. 1, 2015, pp. 5027-5033, vol. 6, Issue 24.
Loredana Protesescu et al., "Nanocrystals of Cesium Lead Halide Perovskites (CsPbX3, X=Cl, Br, and I): Novel Optoelectronic Materials Showing Bright Emission with Wide Color Gamut," Nano Letters, 2014, pp. A-E.
Loredana Protesescu et al., "Nanocrystals of Cesium Lead Halide Perovskites (CsPbX3, X=Cl, Br, and I): Novel Optoelectronic Materials Showing Bright Emission with Wide Color Gamut," Nano Letters, Jan. 29, 2015, pp. 3692-3696, vol. 15, and Support Information.
Maryna I. Bodnarchuk et al., "Rationalizing and Controlling the Surface Structure and Electronic Passivation of Cesium Lead Halide Nanocrystals," ACS Energy Lett. 2019, Nov. 27, 2018, pp. 63-74, vol. 4, Issue No. 1.
NFOA, dated Sep. 20, 2017, U.S. Appl. No. 15/386,512.
Non Final OA dated May 9, 2019 in U.S. Appl. No. 15/393,632.
Non-Final Office Action dated Jul. 18, 2019 for U.S. Appl. No. 15/335,700.
Non-Final Office Action dated Mar. 9, 2020 for U.S. Appl. No. 15/855,436.
Non-Final Office Action dated Jun. 3, 2019 in U.S. Appl. No. 16/111,848.
Non-Final Office Action dated Sep. 21, 2020 in U.S. Appl. No. 16/786,004.
Non-Final Office Action dated Sep. 9, 2020 in U.S. Appl. No. 16/798,948.
Notice of Allowance, dated May 10, 2018, U.S. Appl. No. 15/386,512.
Observations by a third party & J. Am. Chem. Soc. 2015, 137, 10276-10281 dated Jun. 27, 2019 for European Patent Application No. 18179312.6.
Office Action dated Sep. 27, 2020, of the corresponding Chinese Patent Application No. 201610963463.7.
Protesescu et al., "Nanocrystals of Cesium Lead Halide Perovskitess (CsPb, X=Cl, Br and I): Novel Optoelectronic Materials Showing Bright Emission with Wide Color Range", Nnoletters, vol. 15, issue 6. Jun. 10, 2015 pp. 3692-3696.
Zhang et al., "Solution-Phase Synthesis of Cesium Lead Halide Perovskite Nanowires", JACS, 137. 2015, pp. 9230-9233.
Quinten A. Akkerman et al., "Tuning the Optical Properties of Cesium Lead Halide Perovskite Nanocrystals by Anion Exchange Reactions," Journal of the american chemical society, Jul. 27, 2015, pp. 10276-10281, vol. 137.
Sergii Yakunin et al., "Low-threshold amplified spontaneous emission and lasing from colloidal nanocrystals of caesium lead halide perovskites," Nature Communications, Aug. 20, 2015, pp. 1-9.
Sigma Aldrich, Cesium carbonate ReagentPlus®, 99%, www.sigmaaldrich.com/catalog/product/aldrich/44109?lang=de&region=CH, accessed Apr. 17, 2019.
The Grounds of Opposition dated May 15, 2019, of the corresponding application, EP Patent Application No. 16196124.8.
Third Party Submission dated Nov. 8, 2017 in U.S. Appl. No. 15/335,700.
Third-Party Submission dated Dec. 10, 2020 in U.S. Appl. No. 16/798,948.
Third-Party Submission dated Dec. 20, 2017, U.S. Appl. No. 15/393,632.
Woo et al., "Ultrastable PbSe Nanocrystal Quantum Dots via in Situ Formation of Atomically Thin Halide Adlayers on PbSe(100)", Journal of The American chemical Society, 136, 2014, 8883-8886.
Yiming Zhao et al., High-Temperature Luminescence Quenching of Colloidal Quantum Dots, Article, 2012, pp. 9058-9067, vol. 6, No. 10, ACSNANO.
Zhang et al., "Brightly Luminescent and Color-Tunable Coloidal CH3NH3PbX3 (X=Br, I, Cl) Quantum Dots: Potential Alternatives for Display Technology," ACSNano, vol. 9, No. 4, 2015, pp. 4533-4542.
"Full width at half maximum," Wikipedia, printed Apr. 22, 2022, pp. 1-3, https://en.wikipedia.org/wiki/Full_width_at_half_maximum.
Renguo Xie et al., "Synthesis of Cu-Doped InP Nanocrystals (d-dots) with ZnSe Diffusion Barrier as Efficient and Color-Tunable NIR Emitters," J. Am. Chem. Soc., Jul. 9, 2009, pp. 10645-10651, vol. 131.

\* cited by examiner

NANOCRYSTAL PARTICLES AND PROCESSES FOR SYNTHESIZING THE SAME

CROSS-REFERENCE TO RELATED APPLICATION

This application is a continuation in part application of U.S. patent application Ser. No. 14/494,673, filed on Sep. 24, 2014, which claims priority to and the benefit of Korean Patent Applications Nos. 10-2013-0114601 and 10-2014-0124542, filed on Sep. 26, 2013 and Sep. 18, 2014, respectively, and all the benefits accruing therefrom under 35 U.S.C. § 119, the contents of which are incorporated herein in their entirety by reference.

BACKGROUND

1. Field

A nanocrystal particle and a process for synthesizing the same are disclosed.

2. Description of the Related Art

Unlike bulk materials, nanocrystals have physical characteristics (e.g., energy bandgap and melting point) that are an intrinsic property of their particle size. For example, a semiconductor nanocrystal (also known as a quantum dot) is a semiconductor material having a crystalline structure of a size of several nanometers. The semiconductor nanocrystal has a very small size and a large surface area per unit volume and may exhibit a quantum confinement effect. Therefore, the semiconductor nanocrystal has different physicochemical characteristics than the bulk material having the same composition. In other words, the nanocrystal may have selected characteristics by selecting its size. A quantum dot may absorb light from an excitation source to be in an excited state, and may emit energy corresponding to its energy bandgap.

The semiconductor nanocrystal may be synthesized by a vapor deposition method such as metal organic chemical vapor deposition ("MOCVD") or molecular beam epitaxy ("MBE"), or by a wet chemical method of adding a precursor to an organic solvent to grow crystals. In the wet chemical method, organic materials, such as a dispersant, are coordinated to a surface of the semiconductor crystal during the crystal growth to control the crystal growth. Therefore, the nanocrystals produced by the wet chemical method usually have a more uniform size and shape than those produced by the vapor deposition method.

Semiconductor nanocrystal materials having a core-shell structure may exhibit slightly enhanced quantum efficiency. Nonetheless, there remains a need for technologies having enhanced qualities, such as improved quantum efficiency.

SUMMARY

An embodiment provides a semiconductor nanocrystal having enhanced light emitting properties, such as a high quantum yield.

Another embodiment provides a process of preparing the semiconductor nanocrystal having enhanced light emitting properties.

In an embodiment, a nanocrystal particle includes at least one semiconductor material and at least one halogen element, and has a core-shell structure including a core of a first semiconductor nanocrystal, and a shell surrounding the core and including a crystalline or amorphous material, The at least one halogen element may be present as being doped in the particle (e.g., in an elemental form) or as a metal halide.

The halogen element may be substituted in the crystalline structure of the nanoparticle or may be introduced therein as an interstitial atom.

The at least one halogen element may comprise fluorine (F).

The first semiconductor nanocrystal may include a metal selected from a Group II metal, a Group III metal, a Group IV metal, and a combination thereof, and the crystalline or amorphous material may include at least one metal which is different from the metal included in the first semiconductor nanocrystal and which is selected from a Group I metal, a Group II metal, a Group III metal, a Group IV metal, and a combination thereof.

The first semiconductor nanocrystal may include a first semiconductor material, and the crystalline material of the shell may include a second semiconductor material that is deposited on the core and that is different from the first semiconductor material.

The halogen element may be included in the core, and/or the halogen element may be present at an interface between the core and the shell, and/or the halogen element may be present in the shell.

The shell may be a multi-layered shell having at least two layers, each of the layers including the same or different crystalline or amorphous materials, and the halogen element may be present in a region selected from the core, in an inner shell (i.e., an inner layer of the shell), in an outer shell (i.e., an outer layer of the shell being on the inner layer), at an interface between the core and the shell, at an interface between the layers of the shell, and a combination thereof. The halogen element may be present in all of the aforementioned regions.

The halogen element may be included in an amount of greater than or equal to about 0.05 mole percent, based on a total molar amount of the metal of the core of the nanocrystal particle. The halogen element may be included in an amount of less than or equal to about 200%, for example, less than or equal to about 190%, less than or equal to about 180%, less than or equal to about 170%, less than or equal to about 160%, less than or equal to about 150%, less than or equal to about 140%, less than or equal to about 130%, less than or equal to about 120%, less than or equal to about 110%, or less than or equal to about 100% based on a total molar amount of the metal of the core of the nanocrystal particle.

The halogen element may be fluorine, and it may be present in a form selected from a fluoride including a Group I metal, a fluoride including a Group II metal, a fluoride including a Group III metal, and a combination thereof.

The first semiconductor nanocrystal of the core may include a Group II-VI compound, a Group III-V compound, a Group IV-VI compound, a Group IV compound, or a combination thereof, and the crystalline or amorphous material of the shell may include a Group II-VI compound, a Group III-V compound, a Group IV-VI compound, a Group IV compound, a halogen compound containing a metal and a halogen, a metal oxide, or a combination thereof.

The crystalline or amorphous material may include a metal which is different from the metal included in the first semiconductor nanocrystal.

The Group II-VI compound may be selected from:

a binary element compound selected from CdSe, CdTe, ZnS, ZnSe, ZnTe, ZnO, HgS, HgSe, HgTe, MgSe, MgS, and a combination thereof;

a ternary element compound selected from CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a combination thereof; and a quaternary element compound selected from HgZnTeS, CdZnSeS, CdZnSeTe, CdZnSTe, CdHgSeS, CdHgSeTe, CdHgSTe, HgZnSeS, HgZnSeTe, HgZnSTe, and a combination thereof.

The Group III-V compound may be selected from:

a binary element compound selected from GaN, GaP, GaAs, GaSb, AlN, AlP, AlAs, AlSb, InN, InP, InAs, InSb, and a combination thereof;

a ternary element compound selected from GaNP, GaNAs, GaNSb, GaPAs, GaPSb, AlNP, AlNAs, AlNSb, AlPAs, AlPSb, InNP, InNAs, InNSb, InPAs, InPSb, and a combination thereof; and a quaternary element compound selected from GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and a combination thereof.

The Group IV-VI compound may be selected from:

a binary element compound selected from SnS, SnSe, SnTe, PbS, PbSe, PbTe, and a combination thereof;

a ternary element compound selected from SnSeS, SnSeTe, SnSTe, PbSeS, PbSeTe, PbSTe, SnPbS, SnPbSe, SnPbTe, and a combination thereof; and a quaternary element compound selected from SnPbSSe, SnPbSeTe, SnPbSTe, and a combination thereof.

The Group IV compound may be selected from:

a singular element selected from Si, Ge, and a combination thereof; and a binary element compound selected from SiC, SiGe, and a combination thereof.

The crystalline or amorphous material in the shell may include ZnSe, ZnS, ZnSeS, or a combination thereof.

The nanocrystal particle may comprise a bond between the zinc and the fluorine.

The halogen compound containing a metal and a halogen may be selected from LiF, NaF, KF, $BeF_2$, $MgF_2$, $CaF_2$, $SrF_2$, CuF, AgF, AuF, $ZnF_2$, $CdF_2$, $HgF_2$, $AlF_3$, $GaF_3$, $InF_3$, $SnF_2$, $PbF_2$, LiCl, NaCl, KCl, $BeCl_2$, $MgCl_2$, $CaCl_2$, $SrCl_2$, CuCl, AgCl, AuCl, $ZnCl_2$, $CdCl_2$, $HgCl_2$, $AlCl_3$, $GaCl_3$, $InCl_3$, $SnCl_2$, $PbCl_2$, LiBr, NaBr, KBr, $BeBr_2$, $MgBr_2$, $CaBr_2$, $SrBr_2$, CuBr, AgBr, AuBr, $ZnBr_2$, $CdBr_2$, $HgBr_2$, $AlBr_3$, $GaBr_3$, $InBr_3$, $SnBr_2$, $PbBr_2$, LiI, NaI, KI, $BeI_2$, $MgI_2$, $CaI_2$, $SrI_2$, CuI, AgI, AuI, $ZnI_2$, $CdI_2$, $HgI_2$, $AlI_3$, $GaI_3$, $InI_3$, $SnI_2$, $PbI_2$, and a combination thereof.

The metal oxide may be selected from the group consisting of CdO, $In_2O_3$, PbO, HgO, MgO, $Ga_2O_3$, $Al_2O_3$, ZnO, $SiO_2$, zinc oxysulfide, zinc oxyselenide, zinc oxysulfide selenide, indium phosphide oxide, indium phosphide oxysulfide, and a combination thereof.

The shell may include a material having a composition different from that of the first semiconductor nanocrystal, and having a larger bandgap than that of the first semiconductor nanocrystal.

The nanocrystal particle may have a ligand compound coordinating a surface thereof.

The ligand compound may include RCOOH, $RNH_2$, $R_2NH$, $R_3N$, RSH, $R_3PO$, $R_3P$, ROH, RCOOR', $RPO(OH)_2$, $R_2POOH$, or a combination thereof, wherein R and R' are each independently selected from a C1 to C24 alkyl group, a C2 to C24 alkenyl group, and a C6 to C20 aryl group.

In another embodiment, a process of synthesizing a nanocrystal particle includes:

obtaining a first mixture including a first precursor, a ligand compound, and a solvent;

optionally heating the first mixture;

contacting a halogen source (i.e., a source of a halogen element), a second precursor, and optionally a first nanocrystal with the first mixture, which is optionally heated, to obtain a second mixture; and heating the second mixture to a reaction temperature to react the first precursor and the second precursor to obtain a nanocrystal including a semiconductor material and the halogen element.

In the above process, the first precursor may be two or more different compounds and/or the second precursor may be two or more different compounds. These compounds may be added in any order or in the form of a mixture, for example, with a ligand compound and/or a solvent.

The first precursor may include a Group II metal, a Group III metal, a Group IV metal, or a combination thereof, and may be in the form of an elemental metal (i.e., a metal powder), an alkylated metal compound, a metal alkoxide, a metal carboxylate, a metal nitrate, a metal perchlorate, a metal sulfate, a metal acetylacetonate, a metal halide, a metal cyanide, a metal hydroxide, a metal oxide, a metal peroxide, or a combination thereof, and the second precursor may include a Group V element, a Group VI element, a compound including the Group V element or the Group VI element, a compound containing a halogen element, or a combination thereof.

The Group V element, the Group VI element and the compound containing a Group V element or a Group VI element may be selected from sulfur (S), selenium (Se), selenide, tellurium, telluride, phosphorous (P), arsenic (As), arsenide, nitrogen (N), hexanethiol, octanethiol, decanethiol, dodecanethiol, hexadecanethiol, mercaptopropylsilane, sulfur-trioctylphosphine ("S-TOP"), sulfur-tributylphosphine ("S-TBP"), sulfur-triphenylphosphine ("S-TPP"), sulfur-trioctylamine ("S-TOA"), bis(trimethylsilyl)sulfide, ammonium sulfide, sodium sulfide, selenium-trioctylphosphine ("Se-TOP"), selenium-tributylphosphine ("Se-TBP"), selenium-triphenylphosphine ("Se-TPP"), tellurium-tributylphosphine ("Te-TBP"), tellurium-triphenylphosphine ("Te-TPP"), tris(trimethylsilyl)phosphine, tris(dimethylamino)phosphine, triethylphosphine, tributylphosphine, trioctylphosphine, triphenylphosphine, tricyclohexylphosphine, arsenic oxide, arsenic chloride, arsenic sulfate, arsenic bromide, arsenic iodide, nitric oxide, nitric acid, ammonium nitrate, and a combination thereof.

The ligand compound may include a compound represented by RCOOH, $RNH_2$, $R_2NH$, $R_3N$, RSH, $R_3PO$, $R_3P$, ROH, RCOOR', $RPO(OH)_2$, or $R_2POOH$, or a combination thereof, wherein R and R' are independently selected from a C1 to C24 alkyl group, a C2 to C24 alkenyl group, and a C6 to C20 aryl group.

The solvent may be selected from a C6 to C22 primary amine, a C6 to C22 secondary amine, C6 to C40 tertiary amine, a heterocyclic compound having a nitrogen atom, a C6 to C40 olefin, a C6 to C40 aliphatic hydrocarbon, a C6 to C30 aromatic hydrocarbon substituted with a C1 to C20 alkyl group, a primary, secondary, a tertiary phosphine substituted with a C6 to C22 alkyl group, a primary, secondary, a tertiary phosphine oxide substituted with a C6 to C22 alkyl group, a C12 to C22 aromatic ether, and a combination thereof.

The halogen source may include HF, NH$_4$F, HCl, NH$_4$Cl, HBr, NH$_4$Br, LiF, NaF, KF, BeF$_2$, MgF$_2$, CaF$_2$, SrF$_2$, CuF, AgF, AuF, ZnF$_2$, CdF$_2$, HgF$_2$, AlF$_3$, GaF$_3$, InF$_3$, SnF$_2$, PbF$_2$, LiCl, NaCl, KCl, BeCl$_2$, MgCl$_2$, CaCl$_2$, SrCl$_2$, CuCl, AgCl, AuCl, ZnCl$_2$, CdCl$_2$, HgCl$_2$, AlCl$_3$, GaCl$_3$, InCl$_3$, SnCl$_2$, PbCl$_2$, LiBr, NaBr, KBr, BeBr$_2$, MgBr$_2$, CaBr$_2$, SrBr$_2$, CuBr, AgBr, AuBr, ZnBr$_2$, CdBr$_2$, HgBr$_2$, AlBr$_3$, GaBr$_3$, InBr$_3$, SnBr$_2$, PbBr$_2$, LiI, NaI, KI, BeI$_2$, MgI$_2$, CaI$_2$, SrI$_2$, CuI, AgI, AuI, ZnI$_2$, CdI$_2$, HgI$_2$, AlI$_3$, GaI$_3$, InI$_3$, SnI$_2$, PbI$_2$, HBF$_4$, an ionic liquid including a halogen element, and a combination thereof.

The halogen source may be added in the first mixture in an amount of greater than or equal to about 0.5 mole percent, based on a total moles of the first metal of the first precursor.

The halogen source (e.g., HF) may be added as a solution in an carrier solvent, and the carrier solvent may include water, a ketone such as acetone, a primary amine, a secondary amine, a tertiary amine, a heterocyclic compound having a nitrogen atom such as pyridine, a C6 to C40 olefin, a C6 to C40 aliphatic hydrocarbon, a C6 to C30 aromatic hydrocarbon substituted with a C1 to C20 alkyl group, a primary, secondary, or tertiary phosphine substituted with a C6 to C22 alkyl group, a primary, secondary, or tertiary phosphine oxide substituted with a C6 to C22 alkyl group, a C7 to C40 aromatic ether, a C6 to C40 aromatic alcohol, or a combination thereof.

In the solution, a molar concentration of the halogen source may be greater than or equal to about 0.001 moles per liter.

The heating the second mixture to the reaction temperature to trigger a reaction between the first precursor and the second precursor may be conducted without irradiation with microwaves.

In another embodiment, a device may include the nanocrystal particle.

The device may be a light emitting diode ("LED"), an organic light emitting diode ("OLED"), a sensor, an imaging sensor, a solar cell device, or a liquid crystal display ("LCD").

The foregoing method makes it possible to significantly enhance light emitting properties of the semiconductor nanocrystal.

BRIEF DESCRIPTION OF THE DRAWINGS

These and/or other aspects will become apparent and more readily appreciated from the following description of the embodiments, taken in conjunction with the accompanying drawings, in which.

DETAILED DESCRIPTION

Figure 1:
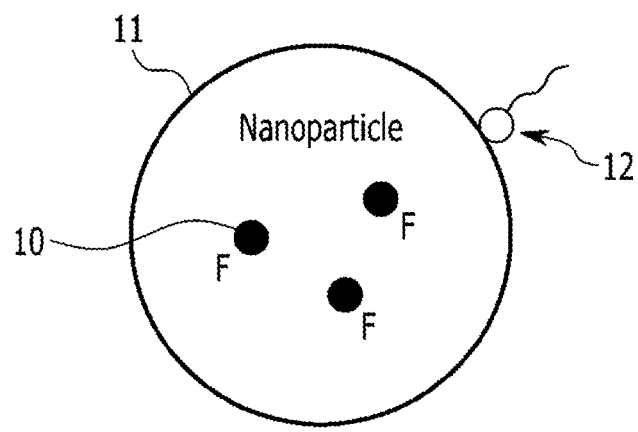
FIG. 1 to FIG. 3 each schematically illustrate an embodiment of a distribution of a halogen element, e.g., fluorine, in the semiconductor nanoparticle.

This disclosure will be described more fully hereinafter in the following detailed description, in which some but not all embodiments of this disclosure are described. This disclosure may be embodied in many different forms and is not be construed as limited to the embodiments set forth herein; rather, these embodiments are provided so that this disclosure will fully convey the scope of the invention to those skilled in the art. Thus, in some exemplary embodiments, well known technologies are not specifically explained. Unless otherwise defined, all terms used in the specification (including technical and scientific terms) may be used with meanings commonly understood by a person having ordinary knowledge in the art. Further, unless explicitly defined to the contrary, the terms defined in a generally-used dictionary are not ideally or excessively interpreted. In addition, unless explicitly described to the contrary, the word "comprise" and variations such as "comprises" or "comprising" will be understood to imply the inclusion of stated elements but not the exclusion of any other elements.

Unless specifically described to the contrary, a singular form includes a plural form.

As used herein, the term "quantum yield" and "light emitting efficiency" are equivalent and may be used interchangeably.

As used herein, the term "and/or" includes any and all combinations of one or more of the associated listed items. Expressions such as "at least one of," when preceding a list of elements, modify the entire list of elements and do not modify the individual elements of the list.

It will be understood that, although the terms first, second, third, etc. may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, a first element, component, region, layer, or section discussed below could be termed a second element, component, region, layer, or section without departing from the teachings of the present embodiments.

The terminology used herein is for the purpose of describing particular embodiments only and is not intended to be limiting. As used herein, the singular forms "a," "an," and "the" are intended to include the plural forms as well, unless the context clearly indicates otherwise. Unless specified otherwise, the term "or" means "and/or."

As used herein, the term "nanocrystal particle" refers to a nano-sized particle including a crystalline material.

As used herein, the term "halogen element" has substantially the same meaning as the term "halogen" and is not limited to an elemental halogen. As used therein, the halogen element may constitute a halide.

As used herein, the term "Group II" may include Group IIA and Group IIB, and examples of the Group II metal includes Cd, Zn, Hg and Mg, but are not limited thereto. As used herein, the term "Group III" may include Group IIIA and Group IIIB, and examples of the Group III metal include, but are not limited to, Al, In, Ga, and Tl.

As used herein, the term "Group IV" may include Group IVA and Group IVB, and examples of the Group IV metal may include, but are not limited to, Si, Ge, and Sn. As used herein, the term "metal" may also include a metalloid such as Si.

As used herein, Group I may include Group IA and Group IB, and examples of the Group I metal may include, but are not limited to, Li, Na, K, Ru, Cs.

"Alkyl" as used herein means a straight or branched chain, saturated, monovalent hydrocarbon group (e.g., methyl or hexyl).

"Alkenyl" means a straight or branched chain, monovalent hydrocarbon group having at least one carbon-carbon double bond (e.g., ethenyl (—HC=CH$_2$)).

"Aryl" means a monovalent group formed by the removal of one hydrogen atom from one or more rings of an arene (e.g., phenyl or napthyl).

"Aliphatic" means a saturated or unsaturated linear or branched hydrocarbon group. An aliphatic group may be an alkyl, alkenyl, or alkynyl group, for example.

"Aromatic" means an organic compound or group comprising at least one unsaturated cyclic group having delocalized pi electrons. The term encompasses both hydrocarbon aromatic compounds and heteroaromatic compounds.

"Substituted" means that the compound or group is substituted with at least one (e.g., 1, 2, 3, or 4) substituent independently selected from a hydroxyl (—OH), a C1-9 alkoxy, a C1-9 haloalkoxy, an oxo (=O), a nitro (—NO$_2$), a cyano (—CN), an amino (—NH$_2$), an azido (—N$_3$), an amidino (—C(=NH)NH$_2$), a hydrazino (—NHNH$_2$), a hydrazono (=N—NH$_2$), a carbonyl (—C(=O)—), a carbamoyl group (—C(O)NH$_2$), a sulfonyl (—S(=O)$_2$—), a thiol (—SH), a thiocyano (—SCN), a tosyl (CH$_3$C$_6$H$_4$SO$_2$—), a carboxylic acid (—C(=O)OH), a carboxylic C1 to C6 alkyl ester (—C(=O)OR wherein R is a C1 to C6 alkyl group), a carboxylic acid salt (—C(=O)OM) wherein M is an organic or inorganic anion, a sulfonic acid (—SO$_3$H$_2$), a sulfonic mono- or dibasic salt (—SO$_3$MH or —SO$_3$M$_2$ wherein M is an organic or inorganic anion), a phosphoric acid (—PO$_3$H$_2$), a phosphoric acid mono- or dibasic salt (—PO$_3$MH or —PO$_3$M$_2$ wherein M is an organic or inorganic anion), a C1 to C12 alkyl, a C3 to C12 cycloalkyl, a C2 to C12 alkenyl, a C5 to C12 cycloalkenyl, a C2 to C12 alkynyl, a C6 to C12 aryl, a C7 to C13 arylalkylene, a C4 to C12 heterocycloalkyl, and a C3 to C12 heteroaryl instead of hydrogen, provided that the substituted atom's normal valence is not exceeded.

In an embodiment, a nanocrystal particle may include at least one semiconductor material and at least one halogen element. The nanocrystal particle may have a ligand compound coordinating a surface thereof. The halogen element may be selected from fluorine (F), chlorine (Cl), bromine (Br), iodine (I), and a combination thereof. The halogen may be fluorine (F). The nanocrystal particle may have a core including a first nanocrystal, and a shell on, e.g., surrounding, the core, the shell including a crystalline or amorphous material. As used herein, "the shell surrounding the core" includes the case where the shell at least partially (or completely) surrounds the core. The shell may be a multi-layered shell having at least two layers, each of the layers including the same or different crystalline or amorphous materials. The core may include a first semiconductor material. The crystalline material of the shell may be a second semiconductor material that is deposited on the core and that is different from the first semiconductor material.

The first semiconductor nanocrystal may of the core include a metal selected from a Group II metal, a Group III metal, a Group IV metal, and a combination thereof, and the crystalline or amorphous material of the shell may include a second metal that is different from the first metal. The second metal may be included in the first semiconductor nanocrystal and is selected from a Group I metal, a Group II metal, a Group III metal, a Group IV metal, and a combination thereof.

Figure 2:
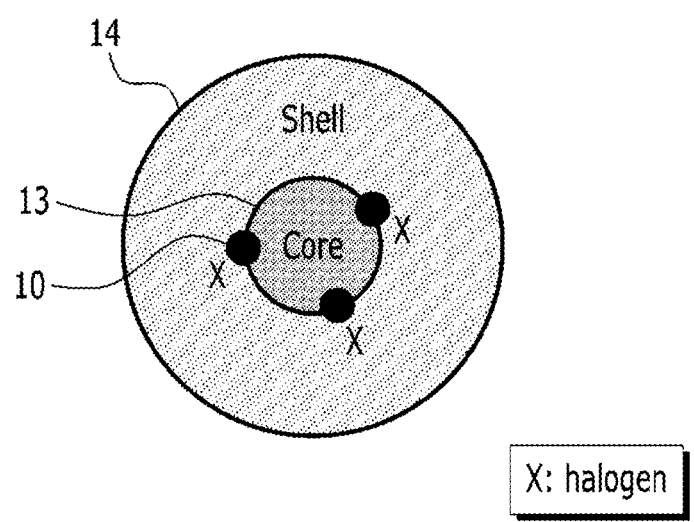
Figure 3:
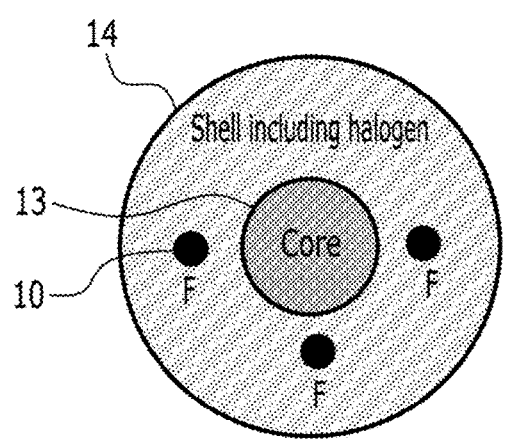

The halogen 10 (e.g., fluorine) may be included in the nanocrystal particle 11 (e.g., a semiconductor nanocrystal particle), for example may be inside the particle (see FIG. 1). For example, the semiconductor nanocrystal particle having a core-shell structure includes the halogen (e.g., fluorine) inside the core. The halogen may be present at an interface between the core 13 and the shell 14 (see FIG. 2). In the nanocrystal particle, the presence of the halogen element at the interface between the core and the shell may be confirmed by the fact that the analysis of the nanocrystal particle detects a halogen compound (e.g., halide) including the halogen element and the core metal and a halogen compound (e.g., halide) including the halogen element and the shell metal at the same time. Without wishing to be bound by any theory, such a result may suggest that the halogen element may be present at the interface between the core and the shell (e.g., a thin interlayer or a thin interdiffusion region formed between the core and the shell). The halogen 10 may be present in the shell (see FIG. 3). When the semiconductor nanocrystal particle has a multi-shell structure, the halogen may be present in the inner shell (i.e., an inner layer of the shell), in the outer shell (i.e., an outer layer of the shell being on the inner layer), or both, wherein the inner shell is between the core and the outer shell. The halogen may be included in an amount of greater than or equal to about 0.05 mole percent, based on a total molar amount of a metal component of the core of the nanocrystal. The nanocrystal particle may have a ligand compound 12 coordinating a surface thereof, but it is not limited thereto The presence of the halogen element included in the nanoparticle (e.g., a semiconductor nanocrystal) may be determined in various manners such as X-ray photoelectron spectroscopy ("XPS"), energy dispersive spectroscopy ("EDS"), a time-of-flight secondary ion mass spectrometry ("TOF-SIMS"), and the like. The halogen may be present in the nanoparticle by being doped therein. The halogen may be present in the form of a metal halide such as a metal fluoride. The metal halide may be selected from a halide including a Group I metal, a halide including a Group II metal, a halide including a Group III metal, and a combination thereof. The halogen element may be substituted into a crystalline structure of the particle or may be introduced as an interstitial atom in the crystalline structure thereof. The halogen element may be in the core, at the interface between the core and the shell, and/or in the shell. In an embodiment, the shell may comprise, or may be a shell consisting of, a metal halide (e.g., a metal fluoride). The metal halide may include a compound selected from LiF, NaF, KF, BeF$_2$, MgF$_2$, CaF$_2$, SrF$_2$, CuF, AgF, AuF, ZnF$_2$, CdF$_2$, HgF$_2$, AlF$_3$, GaF$_3$, InF$_3$, SnF$_2$, PbF$_2$, LiCl$_2$, NaCl, KCl, BeCl$_2$, MgCl$_2$, CaCl$_2$, SrCl$_2$, CuCl, AgCl, AuCl, ZnCl$_2$, CdCl$_2$, HgCl$_2$, AlCl$_3$, GaCl$_3$, InCl$_3$, SnCl$_2$, PbCl$_2$, LiBr, NaBr, KBr, BeBr$_2$, MgBr$_2$, CaBr$_2$, SrBr$_2$, CuBr, AgBr, AuBr, ZnBr$_2$, CdBr$_2$, HgBr$_2$, AlBr$_3$, GaBr$_3$, InBr$_3$, SnBr$_2$, PbBr$_2$, LiI, NaI, KI, BeI$_2$, MgI$_2$, CaI$_2$, SrI$_2$, CuI, AgI, AuI, ZnI$_2$, CdI$_2$, HgI$_2$, AlI$_3$, GaI$_3$, InI$_3$, SnI$_2$, PbI$_2$, and a combination thereof.

A nanocrystal particle including a semiconductor material (as used herein, it may also be referred to as a semiconductor nanocrystal particle) may have an energy bandgap selected based on the size and the composition thereof, and has high color purity in terms of light emitting properties. Therefore, it has attracted a lot of attention as a material that may be utilized in various fields such as a display, the energy industry, the semiconductor industry, and biology related applications. However, most types of the semiconductor nanocrystal particles showing satisfactory properties include cadmium (Cd). Cadmium is one of elements posing serious environmental threats and thus it is urgently desired to develop a cadmium-free semiconductor nanocrystal particle having excellent light-emitting properties. For instance, a Group III-V nanocrystal is an example of a Cd-free semiconductor nanocrystal, but its synthesis process uses a precursor that is far more susceptible to oxidation than a synthesis process for a Cd-based semiconductor nanocrystal (e.g., a CdSe-based quantum dot) and the precursor thereof has poor reactivity, making the control of the reaction much more difficult. The InP/ZnS core-shell semiconductor nanocrystal is an extensively researched Group III-V quantum dots. However, the InP based semiconductor nanocrystals generally tend to exhibit lower light emitting efficiency and poor light emitting properties. In addition, a size of the particle that is used to emit a desired wavelength of light ranges from 2 nanometers (nm) to 5 nm, and thus the synthesis of the InP-based nanocrystal is not easy. Also, the light emitting properties of the Cd-free quantum dots such as the InP nanocrystal are lower than those of the CdSe based quantum dots.

In contrast, in accordance with the aforementioned embodiments, the semiconductor nanocrystal may have significantly enhanced light emitting properties by introducing a halogen element into the semiconductor nanocrystal even when it does not include cadmium. In this regard, there was an attempt to increase light emitting efficiency by treating the semiconductor nanocrystal with hydrofluoric acid and thereby removing an oxide or a dangling bond from a surface of the nanocrystal particle (see S. Adam et al., J. Chem. Phys. 123, 084706, 2005, which is incorporated herein by reference in its entirety). However, the enhancement attainable by the hydrofluoric acid treatment is limited. There was another attempt to treat a surface of an InP nanocrystal before shelling thereon, and it was confirmed that such shelling is very difficult to produce (see J. Mater. Chem., 18, 2653, 2008, which is incorporated herein by reference). Also, a Cd-free semiconductor nanocrystal is often prepared to have a core-shell structure. For example, it is often desired to shell other semiconductor materials such as ZnSe, ZnS, CdS, and the like on the Group III-V core (e.g., an InP core), but it is quite difficult to form a shell on a core with other semiconductor materials and thus enhancing light emitting properties by introducing a core-shell structure may become more difficult (see Comparative Example 4). For example, quantum efficiency of an InP core-shell semiconductor nanocrystal may be normally at most about 40%.

By contrast, the aforementioned semiconductor nanocrystal may show greatly improved light-emitting properties (e.g., high quantum efficiency and narrow full width at half maximum) by introducing a halogen element into the semiconductor nanocrystal particle having a core-shell structure (for example, in the core, in the shell, and/or at an interface therebetween). In particular, the aforementioned semiconductor nanocrystal may have a quantum yield that is comparable or higher than that of the Cd-based semiconductor nanocrystal even when it does not include the cadmium.

The ligand compound may be any suitable ligand compound known in the art without particular limitation. For example, the ligand compound may include a compound represented by RCOOH, RNH$_2$, R$_2$NH, R$_3$N, RSH, R$_3$PO, R$_3$P, ROH, RCOOR', RPO(OH)$_2$, R$_2$POOH, or a combination thereof, wherein R and R' are independently a C1 to C24 alkyl group, a C2 to C24 alkenyl group, and a C6 to C20 aryl group. The organic ligand compound may coordinate the surface of the nanocrystals as prepared, playing a role of well-dispersing the nanocrystals in a solution, and it may have an effect on the light-emitting and electrical characteristics of the nanocrystals. Examples of the organic ligand compound may include, but are not limited to, methanethiol, ethanethiol, propanethiol, butanethiol, pentanethiol, hexanethiol, octanethiol, dodecanethiol, hexadecanethiol, octadecanethiol, benzylthiol, methaneamine, ethaneamine, propaneamine, butaneamine, pentaneamine, hexaneamine, octaneamine, dodecaneamine, hexadecylamine, octadecylamine, dimethylamine, diethylamine, dipropylamine, methanoic acid, ethanoic acid, propanoic acid, butanoic acid, pentanoic acid, hexanoic acid, heptanoic acid, octanoic acid, dodecanoic acid, hexadecanoic acid, octadecanoic acid, oleic acid, benzoic acid, a phosphine such as methylphosphine, ethylphosphine, propylphosphine, butylphosphine, pentylphosphine, and the like, a phosphine oxide compound such as methylphosphine oxide, ethylphosphine oxide, propylphosphine oxide, butylphosphine oxide, and the like, a diphenylphosphine compound, a triphenylphosphine compound, an oxide compound thereof, and the like, and a phosphonic acid, and a combination thereof. The organic ligand compound may be used alone or as a mixture of two or more compounds.

The first nanocrystal (or the first semiconductor material) may include a Group II-VI compound, a Group III-V compound, a Group IV-VI compound, a Group IV compound, or a combination thereof.

The crystalline material (or the second semiconductor material) or the amorphous material may have a different composition from the first nanocrystal (or the first semiconductor material), and may include a Group II-VI compound, a Group III-V compound, a Group IV-VI compound, a Group IV compound, a halogen compound containing a metal (for example, a halide selected from LiF, NaF, KF, BeF$_2$, MgF$_2$, CaF$_2$, SrF$_2$, CuF, AgF, AuF, ZnF$_2$, CdF$_2$, HgF$_2$, AlF$_3$, GaF$_3$, InF$_3$, SnF$_2$, PbF$_2$, LiCl, NaCl, KCl, BeCl$_2$, MgCl$_2$, CaCl$_2$, SrCl$_2$, CuCl, AgCl, AuCl, ZnCl$_2$, CdCl$_2$, HgCl$_2$, AlCl$_3$, GaCl$_3$, InCl$_3$, SnCl$_2$, PbCl$_2$, LiBr, NaBr, KBr, BeBr$_2$, MgBr$_2$, CaBr$_2$, SrBr$_2$, CuBr, AgBr, AuBr, ZnBr$_2$, CdBr$_2$, HgBr$_2$, AlBr$_3$, GaBr$_3$, InBr$_3$, SnBr$_2$, PbBr$_2$, LiI, NaI, KI, BeI$_2$, MgI$_2$, CaI$_2$, SrI$_2$, CuI, AgI, AuI, ZnI$_2$, CdI$_2$, HgI$_2$, AlI$_3$, GaI$_3$, InI$_3$, SnI$_2$, PbI$_2$, and a combination thereof), a metal oxide, or a combination thereof.

The Group II-VI compound may be selected from:

a binary element compound selected from CdSe, CdTe, ZnS, ZnSe, ZnTe, ZnO, HgS, HgSe, HgTe, MgSe, MgS, and a combination thereof;

a ternary element compound selected from CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a combination thereof; and a quaternary element compound selected from HgZnTeS, CdZnSeS, CdZnSeTe, CdZnSTe, CdHgSeS, CdHgSeTe, CdHgSTe, HgZnSeS, HgZnSeTe, HgZnSTe, and a combination thereof.

The Group III-V compound may be selected from:

a binary element compound selected from GaN, GaP, GaAs, GaSb, AlN, AlP, AlAs, AlSb, InN, InP, InAs, InSb, and a combination thereof;

a ternary element compound selected from GaNP, GaNAs, GaNSb, GaPAs, GaPSb, AlNP, AlNAs, AlNSb, AlPAs, AlPSb, InNP, InNAs, InNSb, InPAs, InPSb, and a combination thereof; and a quaternary element compound selected from GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and a combination thereof.

The Group IV-VI compound may be selected from:

a binary element compound selected from SnS, SnSe, SnTe, PbS, PbSe, PbTe, and a combination thereof;

a ternary element compound selected from SnSeS, SnSeTe, SnSTe, PbSeS, PbSeTe, PbSTe, SnPbS, SnPbSe, SnPbTe, and a combination thereof; and a quaternary element compound selected from SnPbSSe, SnPbSeTe, SnPbSTe, and a combination thereof.

The Group IV compound may be a singular element selected from:

Si, Ge, and a combination thereof; and a binary element compound selected from SiC, SiGe, and a combination thereof.

The semiconductor nanocrystal may absorb light of a wavelength of about 300 nm to about 700 nm and emit light of a wavelength from about 400 nm to about 600 nm, from about 600 nm to about 700 nm, or from about 550 nm to about 650 nm. The wavelength of the emitted light may be easily adjusted by controlling the composition and the size of the semiconductor nanocrystal.

The semiconductor nanocrystal may have a quantum yield of about 30% to about 100%, for example, greater than or equal to about 50%, greater than or equal to about 60%, greater than or equal to about 70%, greater than or equal to about 80%, or greater than or equal to about 90%. If desired, the semiconductor nanocrystal may have a wider or narrower full width at half maximum ("FWHM") in its photoluminescence spectrum. For example, in order to be used in a display, the semiconductor nanocrystal may have a narrow FWHM to realize enhanced color purity or color reproducibility. In this case, the semiconductor nanocrystal may have a FWHM of less than or equal to about 50 nm, for example, less than or equal to about 40 nm in its photoluminescence spectrum.

The semiconductor nanocrystal particle may have a particle diameter (the longest diameter in case of a nonspherical particle) ranging from about 1 nm to about 100 nm, for example about 1 nm to about 20 nm.

The shape of the nanocrystal particle, e.g., the semiconductor nanocrystal, is not particularly limited. By way of an example, the nanoparticle may have a spherical shape, a pyramidal shape, a multi-arm shape, or a cubic shape. The nanocrystal may be in the form of a nanosphere, a nanotube, a nanowire, a nano-fiber, a nano-plate, or the like.

In another embodiment, a process of synthesizing a nanoparticle includes:

obtaining a first mixture including a first precursor, a ligand compound, and a solvent;

optionally heating the first mixture;

contacting a source of an halogen element, a second precursor, and optionally a first nanocrystal with the first mixture, which is optionally heated, to obtain a second mixture; and heating the second mixture to a reaction temperature to react the first precursor and the second precursor to obtain a nanocrystal particle including at least one semiconductor material and the halogen element.

The first precursor may include a plurality compounds. The second precursor may include a plurality compounds. When the plurality of compounds is used for the first or second precursor, they may be added at the same time or with a time lag therebetween to the first mixture (optionally heated) either at the same temperature or at different temperatures. In case of the first precursor, a mixture including an additional precursor compound, a ligand, and a solvent is first prepared and then added to the first mixture already prepared.

The first precursor may include a metal selected from Group II metal, a Group III metal or a Group IV metal, and a combination thereof, and The first precursor may be in a form selected from an elemental metal (e.g., a metal powder), an alkylated metal compound, a metal alkoxide, a metal carboxylate, a metal nitrate, a metal perchlorate, a metal sulfate, a metal acetylacetonate, a metal halide, a metal cyanide, a metal hydroxide, a metal oxide, a metal peroxide, and a combination thereof. Examples of the first precursor may include, but are not limited to, dimethyl zinc, diethyl zinc, zinc acetate, zinc acetylacetonate, zinc iodide, zinc bromide, zinc chloride, zinc fluoride, zinc carbonate, zinc cyanide, zinc nitrate, a zinc oxide, zinc peroxide, zinc perchlorate, zinc sulfate, zinc stearate, dimethyl cadmium, diethyl cadmium, cadmium acetate, cadmium acetylacetonate, cadmium iodide, cadmium bromide, cadmium chloride, cadmium fluoride, cadmium carbonate, cadmium nitrate, cadmium oxide, cadmium perchlorate, cadmium phosphide, cadmium sulfate, mercury acetate, mercury iodide, mercury bromide, mercury chloride, mercury fluoride, mercury cyanide, mercury nitrate, mercury oxide, mercury perchlorate, mercury sulfate, lead acetate, lead bromide, lead chloride, lead fluoride, lead oxide, lead perchlorate, lead nitrate, lead sulfate, lead carbonate, tin acetate, tin bis(acetylacetonate), tin bromide, tin chloride, tin fluoride, tin oxide, tin sulfate, germanium tetrachloride, germanium oxide, germanium ethoxide, trimethyl gallium, triethyl gallium, gallium acetylacetonate, gallium-chloride, gallium fluoride, gallium oxide, gallium nitrate, gallium sulfate, trimethyl indium, indium acetate, indium hydroxide, indium chloride, indium oxide, indium nitrate, indium sulfate, thallium acetate, thallium acetylacetonate, thallium chloride, thallium oxide, thallium ethoxide, thallium nitrate, thallium sulfate, and thallium carbonate. The first precursor may be used alone or in a combination thereof depending on the composition of the nanocrystal intended to be synthesized.

The second precursor may be appropriately selected depending on the type of the nanocrystal intended to be synthesized. In a non-limiting example, the second precursor may be a compound including a Group V element or a Group VI element. In another example, the second precursor may be a compound including a halogen (e.g., HF). In some examples, the halogen source and the second precursor may be the same compound. Non-limiting examples of the second precursor may include, but are not limited to, hexanethiol, octanethiol, decanethiol, dodecanethiol, hexadecanethiol, mercaptopropylsilane, sulfur-trioctylphosphine ("S-TOP"), sulfur-tributylphosphine ("S-TBP"), sulfur-triphenylphosphine ("S-TPP"), sulfur-trioctylamine ("S-TOA"), bistrimethylsilyl sulfide, ammonium sulfide, sodium sulfide, selenium-trioctylphosphine ("Se-TOP"), selenium-tributylphosphine ("Se-TBP"), selenium-triphenylphosphine ("Se-TPP"), tellurium-tributylphosphine ("Te-TBP"), tellurium-triphenylphosphine ("Te-TPP"), tris(trimethylsilyl)phosphine, tris(dimethylamino)phosphine, triethylphosphine, tributylphosphine, trioctylphosphine, triphenylphosphine, tricyclohexylphosphine, arsenic oxide, arsenic chloride, arsenic sulfate, arsenic bromide, arsenic iodide, nitric oxide, nitric acid, ammonium nitrate, HF, $NH_4F$, HCl, $NH_4Cl$, HBr, $NH_4Br$, LiF, NaF, KF, $BeF_2$, $MgF_2$, $CaF_2$, $SrF_2$, CuF, AgF, AuF, $ZnF_2$, $CdF_2$, $HgF_2$, $AlF_3$, $GaF_3$, $InF_3$, $SnF_2$, $PbF_2$, LiCl, NaCl, KCl, $BeCl_2$, $MgCl_2$, $CaCl_2$, $SrCl_2$, CuCl, AgCl, AuCl, $ZnCl_2$, $CdCl_2$, $HgCl_2$, $AlCl_3$, $GaCl_3$, $InCl_3$, $SnCl_2$, $PbCl_2$, LiBr, NaBr, KBr, $BeBr_2$, $MgBr_2$, $CaBr_2$, $SrBr_2$, CuBr, AgBr, AuBr, $ZnBr_2$, $CdBr_2$, $HgBr_2$, $AlBr_3$, $GaBr_3$, $InBr_3$, $SnBr_2$, $PbBr_2$, LiI, NaI, KI, $BeI_2$, $MgI_2$, $CaI_2$, $SrI_2$, CuI, AgI, AuI, $ZnI_2$, $CdI_2$, $HgI_2$, $AlI_3$, $GaI_3$, $InI_3$, $SnI_2$, $PbI_2$, and an ionic liquid including a halogen (e.g., fluorine). The second precursor may be used alone or in a combination thereof depending on the composition of the nanocrystal intended to be synthesized.

The ligand compound is the same as set forth above.

The solvent may be selected from a C6 to C22 primary amine such as hexadecyl amine; a C6 to C22 secondary amine such as dioctyl amine; a C6 to C40 tertiary amine such as trioctyl amine; a heterocyclic compound having a nitrogen atom such as pyridine; a C6 to C40 aliphatic hydrocarbon (e.g., an alkane, an alkene, or an alkyne) such as hexadecane, octadecane, octadecene, squalane, and the like; a C6 to C30 aromatic hydrocarbon such as phenyl dodecane, phenyl tetradecane, phenyl hexadecane, and the like; a phosphine substituted with a C6 to C22 alkyl group such as trioctyl phosphine; a phosphine oxide substituted with a C6 to C22 alkyl group such as trioctyl phosphine oxide; a C12 to C22 aromatic ether such as phenyl ether, benzyl ether, and the like; and a combination thereof.

In the first mixture, the amount of the first precursor, the ligand compound, and the solvent may be selected appropriately without any particular limitations.

The optional heating of the first mixture may be carried out by heating the first mixture under vacuum at a temperature of greater than or equal to about 40° C., for example, greater than or equal to about 50° C., greater than or equal to about 60° C., greater than or equal to about 70° C., greater than or equal to about 80° C., greater than or equal to about 90° C., greater than or equal to about 100° C., or greater than or equal to about 120° C., and/or heating the same under a nitrogen atmosphere at a temperature of greater than or equal to about 100° C., for example, greater than or equal to about 150° C., greater than or equal to about 180° C., or greater than or equal to about 200° C., or about 40° C. to about 250° C.

A halogen source and a second precursor are added to the first mixture (as optionally heated) to obtain a second mixture. In an embodiment, the method may further include adding a first nanocrystal to the (optionally heated) first mixture, and thereby the final nanocrystal particle may have a core-shell structure wherein a nanocrystal formed by the reaction between the first and second precursors is deposited on the surface of the first nanocrystal particle (i.e., the core). When the first nanocrystal has a core-shell structure, the final nanocrystal may have a core-multishell structure, and the halogen element may be present at an outer shell.

In the second mixture, the amounts of the halogen source, the second precursor, and the first nanocrystal optionally being added are not particularly limited, and may be selected depending on the nanocrystal structure intended to be obtained.

The halogen source, the second precursor, and optionally the first nanocrystal may be added simultaneously or sequentially. For example, when the halogen source, the second precursor, and optionally the first nanocrystal are added sequentially, the sequence therebetween is not particularly limited. In other words, the halogen source, the second precursor, and optionally the first nanocrystal are added in any order. When the halogen source, the second precursor, and optionally the first nanocrystal are added, the aforementioned solvent and the like may be used together.

The halogen source may include HF, $NH_4F$, HCl, $NH_4Cl$, HBr, $NH_4Br$ LiF, NaF, KF, $BeF_2$, $MgF_2$, $CaF_2$, $SrF_2$, CuF, AgF, AuF, $ZnF_2$, $CdF_2$, $HgF_2$, $AlF_3$, $GaF_3$, $InF_3$, $SnF_2$, $PbF_2$, LiCl, NaCl, KCl, $BeCl_2$, $MgCl_2$, $CaCl_2$, $SrCl_2$, CuCl, AgCl, AuCl, $ZnCl_2$, $CdCl_2$, $HgCl_2$, $AlCl_3$, $GaCl_3$, $InCl_3$, $SnCl_2$, $PbCl_2$, LiBr, NaBr, KBr, $BeBr_2$, $MgBr_2$, $CaBr_2$, $SrBr_2$, CuBr, AgBr, AuBr, $ZnBr_2$, $CdBr_2$, $HgBr_2$, $AlBr_3$, $GaBr_3$, $InBr_3$, $SnBr_2$, $PbBr_2$, LiI, NaI, KI, $BeI_2$, $MgI_2$, $CaI_2$, $SrI_2$, CuI, AgI, AuI, $ZnI_2$, $CdI_2$, $HgI_2$, $AlI_3$, $GaI_3$, $InI_3$, $SnI_2$, $PbI_2$, an ionic liquid containing a halogen element (e.g., fluorine), or a combination thereof.

The halogen source may be used together with a solvent for example, a heterocyclic compound containing nitrogen such as pyridine, $H_2O$, a C3 to C12 ketone such as acetone, methyl ethyl ketone, and the like, a C1 to C40 primary, secondary, tertiary amine such as trioctylamine, or a combination thereof. In an embodiment, the halogen source (e.g., HF) may be dissolved in a carrier solvent to be prepared as a solution, which is then added to the first mixture. The carrier solvent may be water, a heterocyclic compound containing nitrogen such as pyridine, a C3 to C12 ketone such as acetone, methyl ethyl ketone, a primary amine for example having 1 to 40 carbon atoms, a primary alcohol for example having 1 to 40 carbon atoms, a secondary amine for example having 2 to 40 carbon atoms, a secondary alcohol for example having 2 to 40 carbon atoms, a tertiary amine for example having 3 to 40 carbon atoms, a tertiary alcohol for example having 3 to 40 carbon atoms, a heterocyclic compound having nitrogen, an olefin, an aliphatic hydrocarbon, an aromatic hydrocarbon having an alkyl substituent, a phosphine having an alkyl substituent, a phosphine oxide having an alkyl substituent, an aromatic ether, or a combination thereof. In the solution dissolved in the carrier solvent, a molar concentration of the halogen source may be greater than or equal to about 0.001 mol/L.

The ionic liquid is a salt in a liquid state and it consists of an ion and a counter ion thereof. In an embodiment, the ionic liquid may be a substituted or unsubstituted imidazolium salt, a substituted or unsubstituted pyrazolium salt, a substituted or unsubstituted triazolium salt, a substituted or unsubstituted thiazolium salt, a substituted or unsubstituted oxazolium salt, a substituted or unsubstituted pyridazinium salt, a substituted or unsubstituted pyrimidinium salt, a substituted or unsubstituted ammonium salt, a substituted or unsubstituted phosphonium salt, a substituted or unsubstituted sulfonium salt, a substituted or unsubstituted pyridinium salt, a substituted or unsubstituted pyrrolidinium salt, or a combination thereof. The ionic liquid may have a halide anion such as F⁻, a tetrafluoroborate anion ($BF_4^-$), a hexafluorophosphate anion ($PF_6^-$), a perchlorate anion ($ClO_4^-$), an acetate anion, a trifluoroacetate anion, a triflate anion, a hydrogen sulfate anion, an alkyl sulfate anion, a sulphite anion, a hydrogen sulphite anion, a chloroaluminate anion, a tetrabromoaluminate anion, a nitrite anion, a nitrate anion, a dichlorocuprate anion, a phosphate anion, a hydrogen phosphate anion, a dihydrogen phosphate anion, a carbonate anion, a hydrogen carbonate anion, a sulfonate anion, a tosylate anion, or a bis(trifluoromethyl sulphonyl) imide anion. In an embodiment, the ionic liquid may be an imidazolium salt, a pyridinium salt, a phosphonium salt, or an ammonium salt, and it may have F⁻, $BF_4^-$, or $PF_6^-$ as an anion. The ionic liquid may be used alone or in a combination thereof.

The halogen source may be added to the first mixture in an amount of greater than or equal to about 0.5%, for example greater than or equal to about 5%, or greater than or equal to about 10% based on the amount (mole) of the first metal precursor.

The heating the second mixture to the reaction temperature to trigger a reaction between the first precursor and the second precursor may be conducted without irradiation with microwaves.

The reaction temperature is not particularly limited and may be selected properly in light of the types of the first precursor, the second precursor, the halogen source, the solvent as used, and the like. For example, the reaction temperature may be about 100° C. to 350° C., for example, about 220° C. to 320° C.

The first semiconductor nanocrystal may include a Group II-VI compound, a Group III-V compound, a Group IV-VI compound, a Group IV compound, or a combination thereof. In an embodiment, the first nanocrystal may include a Group IIII-V compound.

The nanocrystal formed by the reaction between the first precursor and the second precursor may include at least one compound selected from a Group II-VI compound, a Group III-V compound, a Group IV-VI compound, a Group IV compound, LiF, NaF, KF, $BeF_2$, $MgF_2$, $CaF_2$, $SrF_2$, CuF, AgF, AuF, $ZnF_2$, $CdF_2$, $HgF_2$, $AlF_3$, $GaF_3$, $InF_3$, $SnF_2$, $PbF_2$, LiCl, NaCl, KCl, $BeCl_2$, $MgCl_2$, $CaCl_2$, $SrCl_2$, CuCl, AgCl, AuCl, $ZnCl_2$, $CdCl_2$, $HgCl_2$, $AlCl_3$, $GaCl_3$, $InCl_3$, $SnCl_2$, $PbCl_2$, LiBr, NaBr, KBr, $BeBr_2$, $MgBr_2$, $CaBr_2$, $SrBr_2$, CuBr, AgBr, AuBr, $ZnBr_2$, $CdBr_2$, $HgBr_2$, $AlBr_3$, $GaBr_3$, $InBr_3$, $SnBr_2$, $PbBr_2$, LiI, NaI, KI, $BeI_2$, $MgI_2$, $CaI_2$, $SrI_2$, CuI, AgI, AuI, $ZnI_2$, $CdI_2$, $HgI_2$, $AlI_3$, $GaI_3$, $InI_3$, $SnI_2$, $PbI_2$, and a combination thereof.

The Group II-VI compound, the Group III-V compound, and the Group IV-VI compound are the same as set forth above. When the semiconductor nanocrystal includes at least two kinds of compounds or when it is a binary element compound, a ternary element compound, or a quaternary element compound, it may be present in a form of an alloy, or in a form of a structure wherein at least two different crystalline structures coexist as layers such as a core/shell or as compartments such as multi-pods.

The aforementioned method of synthesizing a nanocrystal particle may further include: adding a non-solvent to the reaction product between the first and second precursors to separate a nanocrystal particle, to which the ligand compound is coordinated. The non-solvent may be a polar solvent that may be mixed with the solvent used during the reaction, but is not capable of dispersing nanocrystals. The non-solvent may be selected depending on the types of the solvent being used in the reaction. For example, the non-solvent may be selected from acetone, ethanol, butanol, isopropanol, water, tetrahydrofuran ("THF"), dimethyl sulfoxide ("DMSO"), diethylether, formaldehyde, acetaldehyde, ethylene glycol, a solvent having a similar solubility parameter to the foregoing solvent, and a combination thereof. The separation may be performed using centrifugation, precipitation, chromatography, or distillation. The separated nanocrystals may be added into a washing solvent as needed. The washing solvent is not particularly limited, and may be a solvent having a similar solubility parameter to the ligand, such as hexane, heptane, octane, chloroform, toluene, benzene, and the like.

The nanocrystal prepared in accordance with the aforementioned process may exhibit a high level of quantum yield. The semiconductor nanocrystal compositions may find their utility in various fields such as a light emitting diode ("LED"), a solar cell, a biosensor, or image sensor. According to the aforementioned method, it is possible to obtain a semiconductor nanocrystal particle having enhanced light emitting properties.

Hereinafter, the present invention is illustrated in more detail with reference to specific examples. However, they are exemplary embodiments of the present invention, and the present invention is not limited thereto.

EXAMPLES

Example I

Reference Example 1: Preparation of InP Core 0.2 mmol of indium acetate, 0.6 mmol of palmitic acid, and 10 mL of 1-octadecene are placed in a flask, subjected to a vacuum state at 120° C. for one hour, and then heated to 280° C. after the atmosphere in the flask is exchanged with $N_2$. Then, a mixed solution of 0.1 mmol of tris(trimethylsilyl)phosphine ("TMS3P") and 0.5 mL of trioctylphosphine ("TOP") is quickly injected and the reaction proceeds for 20 minutes. The reaction mixture then is rapidly cooled and acetone is added thereto to produce nanocrystals, which are then separated by centrifugation and dispersed in toluene. UV first absorption maximum of the InP core nanocrystals thus prepared is 420-600 nm.

Example 1: Preparation of InP(F) Nanocrystal

As used therein, the term "composition of the compound (halogen atom)" (e.g., "InP(F)") refers to the case where the halogen atom (e.g., fluorine) is included in the semiconductor nanocrystal particle of a certain composition (e.g., InP) in any manner (for example, as a doped element, as a metal halide (InF), and/or being substituted into a crystalline structure or being introduced as an interstitial atom.

0.2 mmol of indium acetate, 0.6 mmol of palmitic acid, and 10 mL of 1-octadecene are placed in a flask, subjected to a vacuum state at 120° C. for one hour, and then heated to 280° C. after the atmosphere in the flask is exchanged with $N_2$. A solution of a mixture of 0.07 mmol of HF and 1.5 mL of trioctyl amine is quickly injected thereto and then a mixed solution of 0.1 mmol of tris(trimethylsilyl)phosphine ("TMS3P") and 0.5 mL of trioctylphosphine ("TOP") is quickly injected. The reaction proceeds for 20 minutes. The reaction mixture is then rapidly cooled to room temperature and acetone is added thereto to produce nanocrystals, which are then separated by centrifugation and dispersed in toluene.

Example II

Example 2-1: Preparation of an InP/ZnS(F) Nanocrystal Particle 1.2 mmoL (0.224 g) of zinc acetate, 2.4 mmol (0.757 g) of oleic acid, and 10 mL of trioctylamine are placed in a flask, subjected to a vacuum state at 120° C. for 10 minutes, and then heated to 280° C. after the atmosphere in the flask is exchanged with $N_2$. A toluene dispersion of the InP semiconductor nanocrystal prepared in Reference Example 1 (OD=optical density of $1^{st}$ excitonic absorption, OD:0.15, or 1 ml of a 1 wt % toluene solution) is added thereto within 10 seconds, and then 1.5 mL of a mixed solution including 0.14 mmol of HF (6 microliters (μL) of an aqueous solution) in trioctylamine (TOA, a carrier solvent) is quickly injected, immediately after which 2.4 mmol of S/TOP is added thereto and the reaction proceeds for 120 minutes. After that, the reaction mixture is rapidly cooled to room temperature and acetone is added thereto to produce nanocrystal particles, which are then separated by centrifugation and dispersed again in toluene.

Example 2-2

InP/ZnS(F) nanocrystal particles are prepared in the same manner as set forth in Example 2-1, except that HF is used in an amount of 0.07 mmol instead of 0.14 mmol.

Example 2-3

InP/ZnS(F) nanocrystal particles are prepared in the same manner as set forth in Example 2-1, except that HF is used in an amount of 0.2 mmol instead of 0.14 mmol.

Example 2-4

InP/ZnS(F) nanocrystal particles are prepared in the same manner as set forth in Example 2-1, except that HF is used in an amount of 0.4 mmol instead of 0.14 mmol.

Example 2-5

InP/ZnS(F) nanocrystal particles are prepared in the same manner as set forth in Example 2-1, except that instead of HF, pyridine-HF is used as a fluorine source.

Example 2-6

InP/ZnS(F) nanocrystal particles are prepared in the same manner as set forth in Example 2-1, except that instead of HF, $NH_4F$ is used as a fluorine source.

Example 2-7

InP/ZnS(F) nanocrystal particles are prepared in the same manner as set forth in Example 2-1, except that instead of HF, $ZnF_2$ is used as a fluorine source.

Example 2-8

InP/ZnS(F) nanocrystal particles are prepared in the same manner as set forth in Example 2-1, except that instead of HF, an ionic liquid, 1-Butyl-3-methylimidazolium tetrafluoroborate is used as a fluorine source.

Examples 2-9 to 2-11

Quantum yield depending on the introduction sequence of the first nanocrystal, the source of the fluorine element, and the second precursor InP/ZnS(F) nanocrystal particles are prepared in the same manner as set forth in Example 2-1, except that (1) an InP core, (2) an HF/TOA solution, and (3) 0.6 mmol of S/TOP are introduced according to the sequence set forth in Table 1.

TABLE 1

| | Example 2-1 | Example 2-9 | Example 2-10 | Example 2-11 |
|---|---|---|---|---|
| Introduction sequence | (1) → (2) → (3) | (1) → 5 min. → (2) → (3) | ((1) + (2) 5 min. mixing) → (3) | (1) → (3) → 5 min. → (2) |

Example 2-12

InP/ZnS(F) nanocrystal particles are prepared in the same manner as set forth in Example 2-1, except that 1.5 mL of a mixed solution including 0.14 mmol HF (aqueous solution 6 μL)/acetone (a carrier solvent) is used instead of a mixed solution of HF/TOA.

Comparative Example 1: Preparation of InP/ZnS Nanocrystal

An InP/ZnS nanocrystal particle is prepared in the same manner as set forth in Example 2-1, except that the mixed solution including 0.14 mmol of HF (6 μL of an aqueous solution) in trioctylamine (TOA, a carrier solvent) is not used.

Evaluation II

The structures of the nanocrystals of Example 2-1 and Comparative Example 1 are determined.

Figure 5:
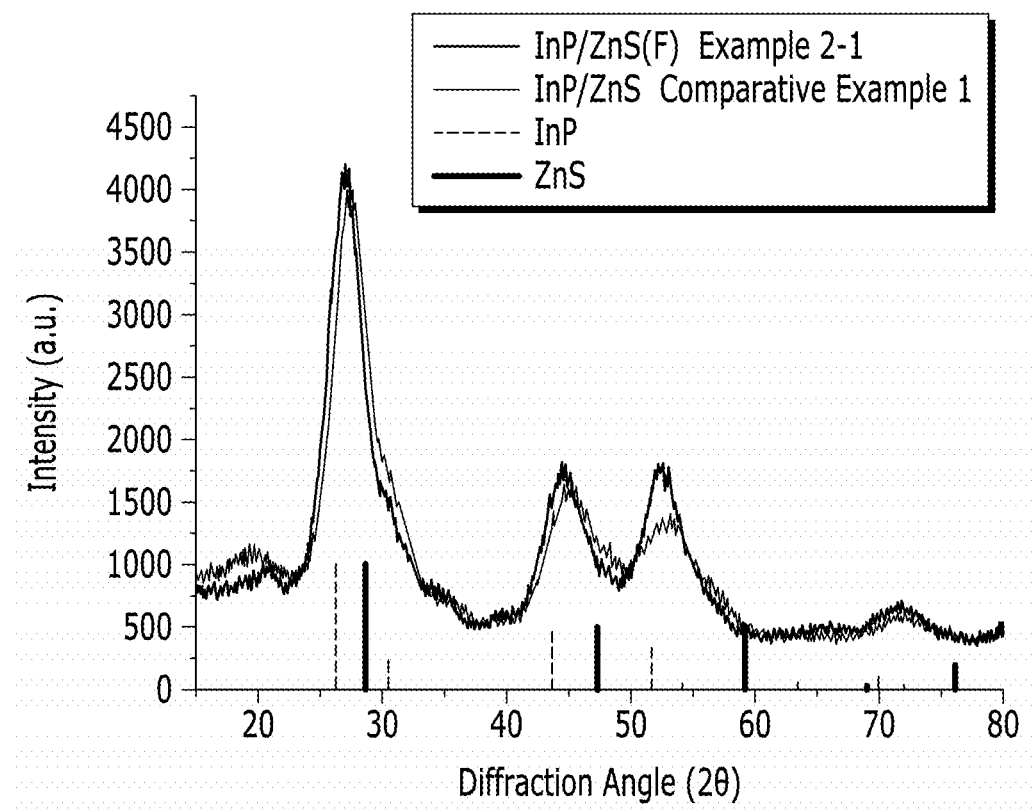
FIG. 5 is a graph of intensity (arbitrary units, a.u.) versus diffraction angle (degrees two-theta, 2θ) which includes X-ray diffraction ("XRD") spectra of the nanocrystals prepared in Example 2-1 and Comparative Example 1, respectively.

An X-ray diffraction analysis is made for the nanocrystal particles prepared above using Philips XPert PRO at a power of 3 kW to find out the crystalline structure of InP/ZnS. The results are shown in FIG. 5. FIG. 5 confirms that the nanocrystals of Example 2-1 and Comparative Example 1 have a crystalline structure of InP/ZnS.

Figures 6A, 6B:
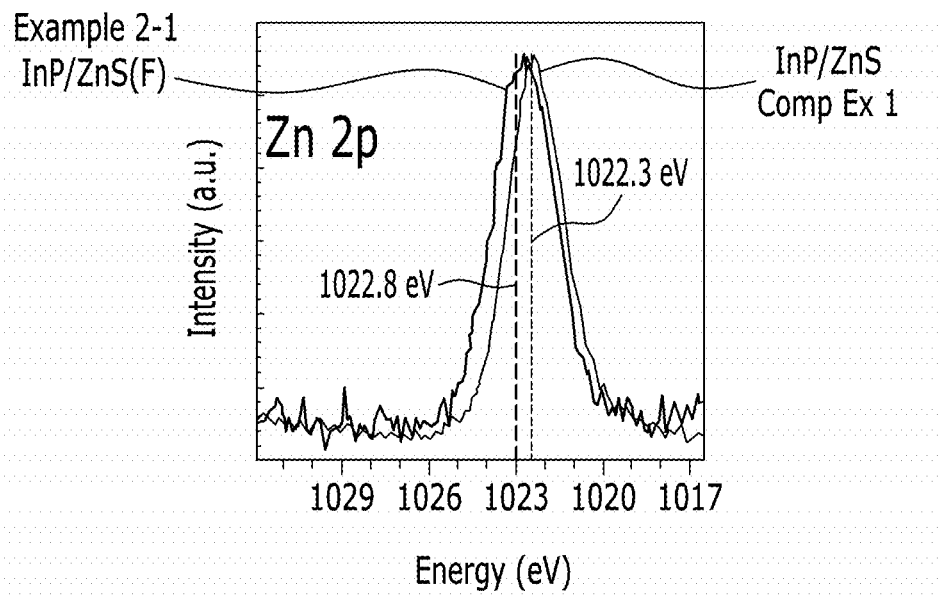
FIGS. 6A and 6B are each a graph of intensity (arbitrary units, a.u.) versus energy (electron volts, eV) showing the results of the XPS element analysis of the nanocrystal prepared in Example 2-1.

An X-ray photoelectron spectroscopy elemental analysis is made for the nanocrystal particles prepared using Quantum 2000 of Physical Electronics under the following conditions: 0.5-15 keV, 300 W, minimum analysis region: 10 micro, sputter rate: 0.1 nm/min. The results are shown in Table 2 and FIG. 6A and FIG. 6B. The results of Table 2 confirm that the particles have fluorine thereinside. The upward shift of Zn 2P binding energy may confirm the Zn—F bonding. The results confirm that the nanocrystal particle of Comparative Example 1 does not have fluorine therein.

TABLE 2

| | XPS analysis (mole ratio) | | | | | | |
|---|---|---|---|---|---|---|---|
| | F | P | S | Zn | In | F/Zn | F/In |
| InP (Reference Example 1) | 0 | 2.83 | 0.00 | 0.00 | 5.77 | — | — |
| InP/ZnS (Comparative Example 1) | 0 | 2.2 | 3.75 | 5.98 | 2.99 | 0.00 | |

TABLE 2-continued

| | XPS analysis (mole ratio) | | | | | | |
|---|---|---|---|---|---|---|---|
| | F | P | S | Zn | In | F/Zn | F/In |
| InP/ZnS(F) (Example 2-1) | 0.12 | 2.18 | 0.75 | 2.00 | 1.40 | 0.06 | 0.08 |

Figure 7A:
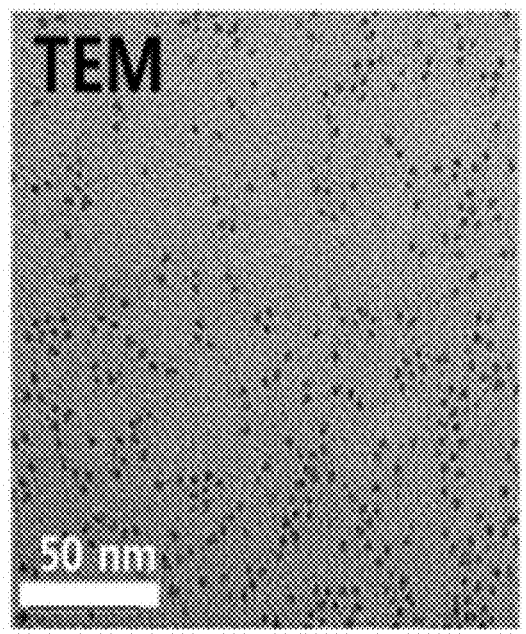
FIGS. 7A and 7B show the results of the TEM-EDS analysis of the nanocrystal prepared in Example 2-1.
Figure 7B:
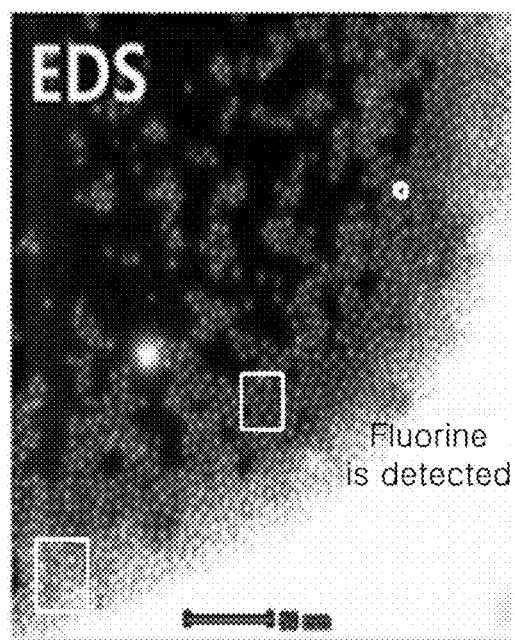
Figure 7C:
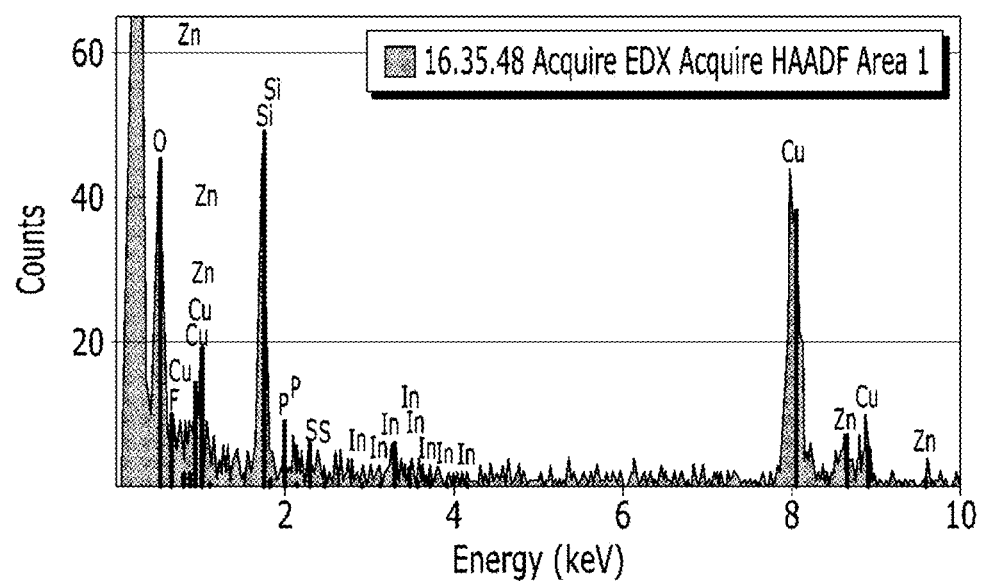
FIG. 7C is a graph of counts versus energy "kiloelectron volts, keV") showing the results of energy dispersive X-ray diffraction analysis of the nanocrystal prepared in Example 2-1.

In addition, a transmission electronic microscopy-electron dispersive spectroscopy (TEM-EDS) analysis is made to prove the presence of fluorine in the nanocrystal particle of Example 2-1 and the synthesis of InP/ZnS(F). The results are shown in FIG. 7A, FIG. 7B, and FIG. 7C. The TEM results of FIG. 7 confirm that an InP/ZnS(F) nanocrystal particle as synthesized has a size of about 2 to 5 nm. The EDS results of FIG. 7A to 7C confirm that fluorine is present inside the nanocrystal particle.

Figure 9:
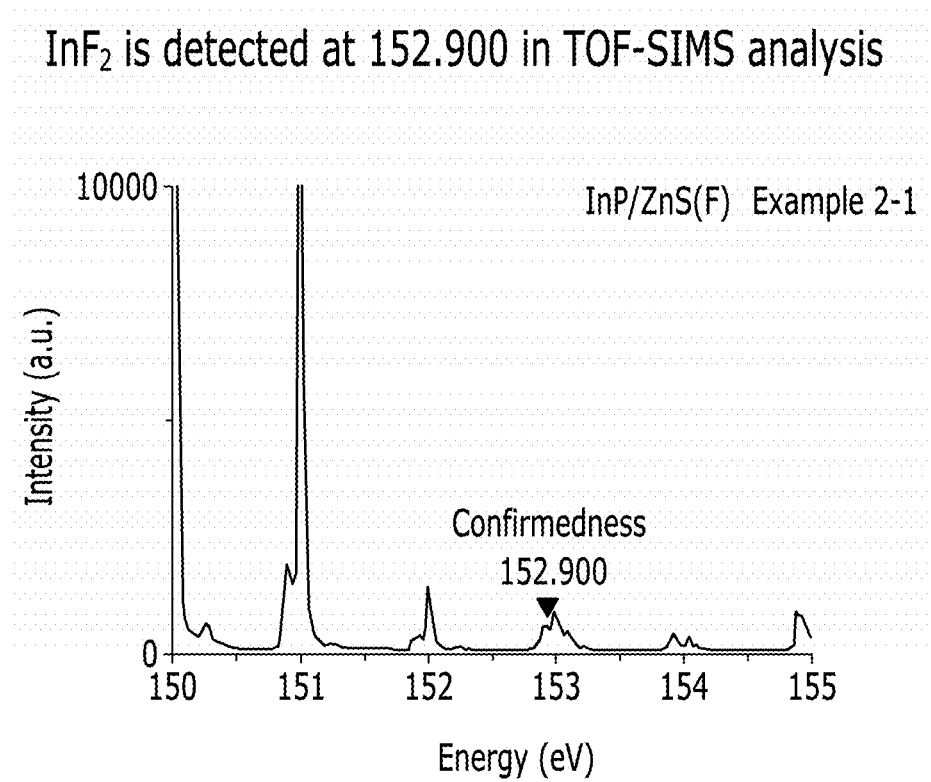
FIG. 9 is graph of intensity (a. u.) versus mass to charge ratio (m/z) showing the results of TOF-SIMS analysis of the nanocrystal of Example 2-1.

For the nanocrystals of Example 2-1 and Comparative Example 1, A Time-of-Flight Secondary Ion Mass Spectrometry (TOF-SIMS) analysis is made using TOF-SIMS V (ION-TOF GmbH, Germany) equipped with a 25 keV Bi+ ion gun, and the result are shown in Table 3 and FIG. 9.

For TOF-SIMS imaging, the ion gun is operated at 5 kHz with a 0.2 picoamperes (pA) (Bi+) average current at the sample holder. A bunch pulse of a 0.7 ns duration resulted in mass resolution (M/DM)>8000. A 200×200 mm² area is rastered by primary ions to obtain the SIMS spectra while maintaining the ion dose about $10^{12}$ ions cm$^{-2}$. The negative ion mass spectra are internally calibrated using C—, CH—, $C_2H$—, and $C_4H$— peaks.

The results of Table 3 and FIG. 9 confirm that the nanocrystal of Example 2-1 include an In—$F_2$ bonding (whose peak is detected at m/z 152.900) and Zn—F bonding. The XPS spectrum confirms the presence of the Zn—F bonding, and thus it may be understood that in the nanocrystal of Example 2-1, the fluorine is present at an interface of the InP core and the ZnS shell.

TABLE 3

| TOF-SIMS sample | InP | InF | InF$_2$ | ZnS | ZnF |
|---|---|---|---|---|---|
| InP/ZnS (Comparative Example 1) | O | X | X | O | X |
| InP/ZnS(F) (Example 2-1) | O | X | O | O | O |

The quantum yields of the nanocrystals of Examples 2-1 to 2-12 and Comparative Example 1 are evaluated.

Figure 4:
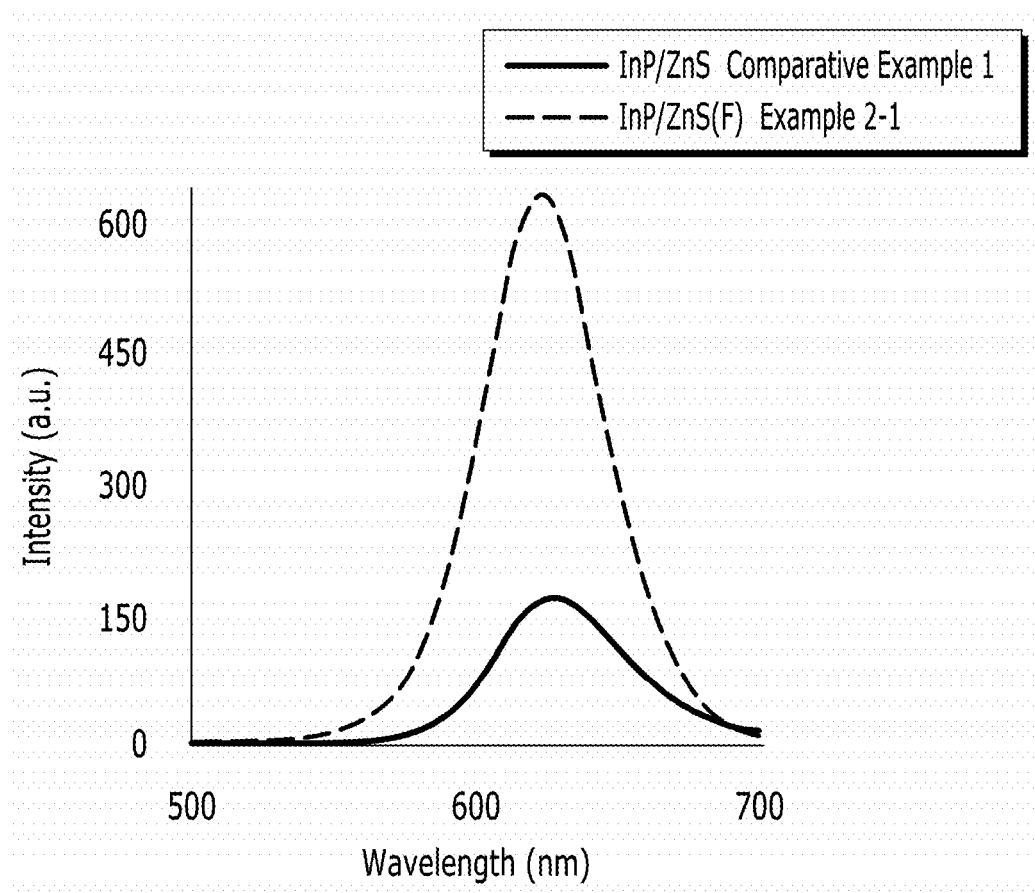
FIG. 4 is a graph of intensity (arbitrary units, a.u.) versus wavelength (nanometers, nm) showing photoluminescence ("PL") spectra of the nanocrystals prepared in Example 2-1 and Comparative Example 1, respectively.

To this end, using a spectrometer (manufactured by Hitachi Co. Ltd., model name: F-7000), a photoluminescence spectrum is obtained for the nanocrystal particles prepared in Example 2-1 and Comparative Example 1 and the results are shown in FIG. 4. The results of FIG. 4 confirm that the semiconductor nanocrystals of Example 2-1 has a very high quantum yield of 73% at a wavelength of 618 nm in comparison with the nanocrystal of Comparative Example 1 having a quantum yield of 31% at a wavelength of 624 nm. The quantum yield may be improved by at least about two times.

The quantum yields and the wavelength of emitted light (nm) at the maximum QY for the nanocrystals of Examples 2-1 to 2-4 and Comparative Example 1 are summarized in Table 4.

TABLE 4

| | Comp. Example 1 | Example 2-2 | Example 2-1 | Example 2-3 | Example 2-4 |
|---|---|---|---|---|---|
| Quantum yield (%) | 31% | 69% | 73% | 73% | 66% |
| Wavelength of emitted light (nm) | 624 | 618 | 618 | 618 | 627 |

The results of Table 4 confirm that the nanocrystals of Examples 2-1 to 2-4 have greatly improved values of the quantum yield in comparison with the nanocrystal of Comparative Example 1.

Table 5 shows the quantum yields of the nanocrystals of Examples 2-5 to 2-8 and Example 2-12 and Comparative Example 1.

TABLE 5

| | Comp. Example 1 | Example 2-5 | Example 2-6 | Example 2-7 | Example 2-8 | Example 2-12 |
|---|---|---|---|---|---|---|
| Quantum yield (%) | 31% | 64% | 66% | 50% | 63% | 85% |

Table 5
The results of Table 5 confirm that the nanocrystals of Examples 2-1 to 2-8 and Example 2-12 have greatly improved values of the quantum yield in comparison with the nanocrystal of Comparative Example 1.

Table 6 shows the quantum yields of the nanocrystals of Examples 2-9 to 2-11 and Comparative Example 1.

TABLE 6

| | Comp. Example 1 | Example 2-1 | Example 2-9 | Example 2-10 | Example 2-11 |
|---|---|---|---|---|---|
| Quantum yield (%) | 31% | 73% | 57% | 42% | 64% |

Referring to Table 6, the sequence of introducing the reactants may control the quantum yield of the nanocrystals, and the nanocrystals of Examples 2-1 and 2-9 to 2-11 have greatly improved values of the quantum yield in comparison with the nanocrystal of Comparative Example 1.

Example III

Example 3: Preparation of InP/ZnSe(F) Nanocrystal

An InP/ZnSe(F) nanocrystal particle is prepared in the same manner as set forth in Example 2-1, except that 2.4 mmol of Se/TOP is used instead of S/TOP.

Comparative Example 2: Preparation of InP/ZnSe Nanocrystal

An InP/ZnSe nanocrystal particle is prepared in the same manner as set forth in Example 2-1, except that HF is not used and 2.4 mmol of Se/TOP is added instead of S/TOP.

Evaluation III
For the nanocrystals of Example 3 and Comparative Example 2, the photoluminescence spectrums are obtained in the same manner as Evaluation II and the results of the quantum yield and the light-emitting wavelength at the maximum efficiency are shown in Table 7.

TABLE 7

|  | Comp. Example 2 InP/ZnSe | Example 3 InP/ZnSe(F) |
|---|---|---|
| Quantum yield (%) | 21 | 40 |
| Light emitting wavelength of the maximum efficiency (nm) | 642 | 637 |

Referring to Table 7, the nanocrystals of Example 3 shows greatly improved value of the quantum yield in comparison with the nanocrystal of Comparative Example 2.

Example IV

Example 4: Preparation of InP/ZnSeS(F) Nanocrystal

An InP/ZnSeS(F) nanocrystal particle is prepared in the same manner as set forth in Example 2-1, except that 1.2 mmol of Se/TOP is used together with 1.2 mmol of S/TOP.

Comparative Example 3: Preparation of InP/ZnSeS Nanocrystal

An InP/ZnSe nanocrystal particle is prepared in the same manner as set forth in Example 2-1, except that HF is not used and 1.2 mmol of Se/TOP is added together with 1.2 mmol of S/TOP.

Evaluation IV

For the nanocrystals of Example 4 and Comparative Example 3, the photoluminescence spectrums are obtained in the same manner as Evaluation II and the results of the quantum yield and the light-emitting wavelength at the maximum efficiency are shown in Table 8.

TABLE 8

|  | Comp. Example 3 InP/ZnSeS | Example 4 InP/ZnSeS(F) |
|---|---|---|
| Quantum yield (%) | 35 | 50 |
| Light emitting wavelength of the maximum efficiency (nm) | 619 | 621 |

Referring to Table 8, the nanocrystals of Example 4 shows greatly improved value of the quantum yield in comparison with the nanocrystal of Comparative Example 3.

Example V

Example 5: Preparation of InP/ZnF$_2$ Nanocrystal

An InP/ZnF$_2$ nanocrystal particle is prepared in the same manner as set forth in Example 2-1, except that S/TOP is not used.

Example 6: Preparation of InP/ZnS/ZnS(F)

An InP/ZnS/ZnS(F) nanocrystal particle is prepared in the same manner as set forth in Example 2-1, except that the InP/ZnS nanocrystal obtained in Comparative Example 2 is used instead of the InP nanocrystal.

Evaluation V-1

The crystalline structure of the nanocrystal particle obtained in Example 5 is confirmed.

Figure 8:
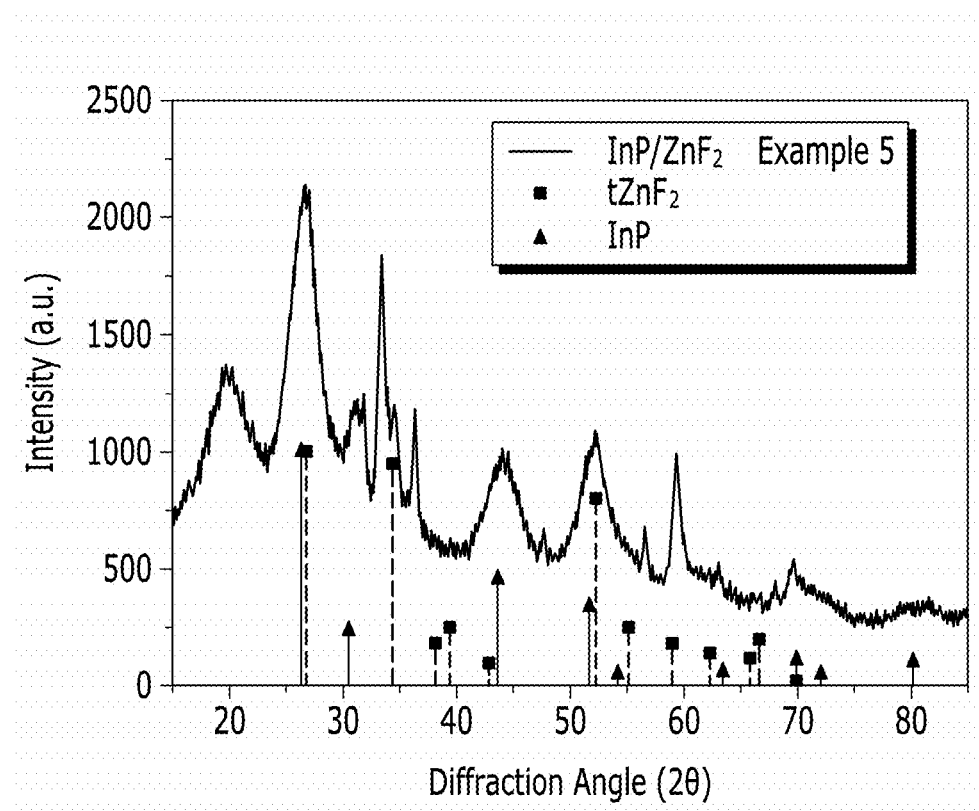
FIG. 8 is a graph of intensity (a. u.) versus diffraction angle (2θ) showing the results of XRD analysis of the nanocrystal prepared in Example 5.

An XRD analysis is made in the same manner as set forth in Evaluation II and the results are shown in FIG. 8, which confirms the presence of the ZnF$_2$ crystal. A TOF-SIMS analysis is made in the same manner as set forth in Evaluation II and the results are compiled in Table 9, which confirms the presence of ZnF bonding.

TABLE 9

| TOF-SIMS Sample |  | InP | InF | InF$_2$ | ZnS | ZnF |
|---|---|---|---|---|---|---|
| Comp. Example 1 | InP/ZnS | ◯ | X | X | ◯ | X |
| Example 5 | InP/ZnF$_2$ | ◯ | X | X | X | ◯ |

For the nanocrystal particle of Example 6, the results of the ICP-AES confirm the formation of a ZnS(F) shell. In this case, fluorine is not present at the interface between InP and ZnS but is present in the outer ZnS shell.

Evaluation V-2

The photoluminescence spectrums of the nanocrystals prepared in Examples 5 and 6 are obtained in the same manner as Evaluation II and the results are shown in Table 10.

TABLE 10

|  | Example 5 InP/ZnF$_2$ | Example 6 InP/ZnS/ZnS(F) |
|---|---|---|
| Quantum yield (%) | 49 | 60 |

Referring to Table 10, the nanocrystals of Examples 5 and 6 shows an enhanced quantum yield.

Example VI

Example 7: Preparation of InP/ZnS(Cl) Nanocrystal Particles

InP/ZnS(Cl) nanocrystal particles are prepared in the same manner as set forth in Example 2-1, except that HCl is used instead of HF.

Evaluation VI

An XPS analysis is made in the same manner as set forth in Evaluation II and the results show that the nanocrystal particle of Example 7 includes chlorine in an amount of 1% based on the amount of Zn. The PL spectrum of the nanocrystal particle of Example 7 is obtained in the same manner as set forth in Evaluation II, and it show that the quantum yield of the InP/ZnS(Cl) nanocrystal of Example 7 is about 36%, which is higher than that of InP/ZnS by 5%.

Comparative Example 4: ZnS Shelling after the HF Etching

The InP cores prepared in Reference Example 1 are dispersed in a mixed solution of 0.14 mmol HF (in water) and 1.5 ml TOA, and irradiated with UV for 10 minutes. Ethanol is added thereto to cause precipitation of the nanocrystals, which are then separated by centrifugation and re-dispersed in toluene.

1.2 mmoL (0.224 g) of zinc acetate, 2.4 mmol (0.757 g) of oleic acid, and 10 mL of trioctylamine are placed in a flask, subjected to a vacuum state at 120° C. for 10 minutes, and then heated to 280° C. after the atmosphere in the flask is exchanged with N$_2$. A toluene dispersion of the InP core being treated with HF as above is added thereto within 10 seconds, and 2.4 mmol of S/TOP is added thereto and the reaction proceeds for 120 minutes. After that, the reaction mixture is rapidly cooled to room temperature and acetone is added thereto to produce nanocrystal particles, which are then separated by centrifugation and dispersed again in toluene.

Figure 10:
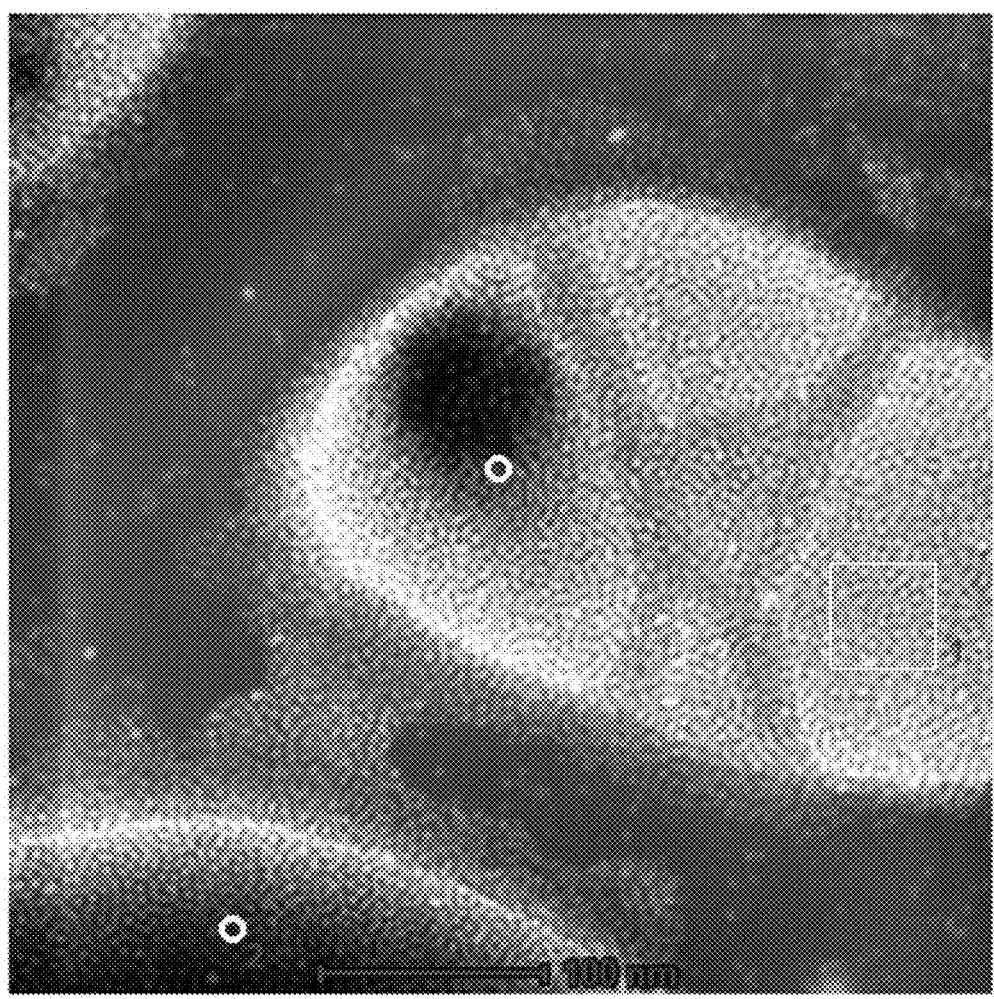
FIG. 10 shows the results of the TEM analysis of the nanocrystal of Comparative Example 4.
Figure 11:
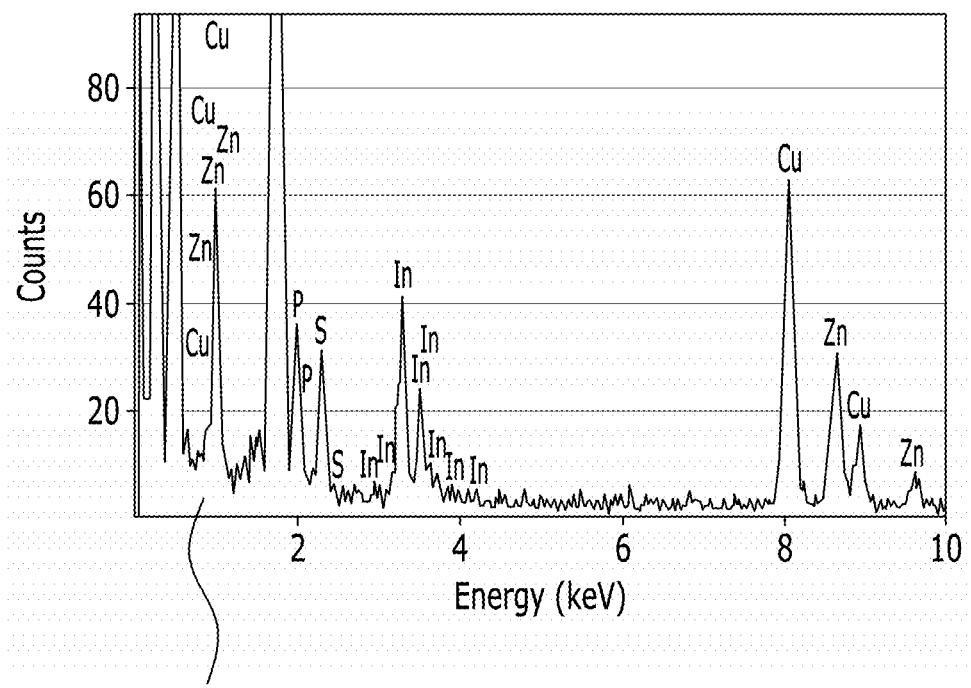
FIG. 11 is a graph of counts versus energy "kiloelectron volts, keV) showing the results of energy dispersive X-ray diffraction analysis of the nanocrystal prepared in Comparative Example 4.

The quantum yield of the nanocrystal thus obtained is measured in accordance with the same manner as Evaluation II, and the results confirm that no substantial increase is found in quantum yield. The XPS analysis, the EDS analysis, and the TOF-SIMS analysis may confirm that no fluorine is present in the nanocrystal thus obtained. A TEM-EDS analysis is made in the same manner as set forth in Example II and the results are shown in FIG. 10 and FIG. 11, confirming that fluorine does not exist in the nanocrystals as prepared.

Example 7: an InZnP Core and a Multi-Layered Shell with Using Fluorine

[1] Production of an InZnP Core 0.2 mmol of indium acetate, 0.125 mmol of zinc acetate, 0.6 mmol of palmitic acid, and 10 mL of 1-octadecene are placed into a reactor and heated at 120° C. under vacuum. The atmosphere in the reactor is substituted with nitrogen after one hour. After heating at 280° C., a mixed solution of 0.15 mmol of tris(trimethylsilyl)phosphine (TMS3P) and 1 mL of trioctylphosphine is rapidly added thereto and reacted for 20 minutes. The reaction solution is rapidly cooled to room temperature and added with acetone and centrifuged to provide a precipitate, which is then dispersed in toluene.

[2] A Multi-Layered Shell Formation on the InZnP Core with Fluorine

A shelling process is used to form a multi-layered shell comprising Zn, Se and S. Specifically, 1.2 mmoL (0.224 g) of zinc acetate, 2.4 mmol (0.757 g) of oleic acid and 10 mL of trioctylamine are placed in a flask subjected to a vacuum state at 120° C. for 10 minutes and then heated to 280° C. after the atmosphere in the flask is exchanged with N2. A toluene dispersion of the InZnP semiconductor nanocrystal prepared above is added thereto within 10 seconds, and a predetermined amount of S/TOP and a predetermined amount of Se/TOP is added several times at a predetermined time interval (each time with a varying ratio between the S/TOP and Se/TOP) to form a multilayered shell (with each layer having a different composition). During the shell formation, 0.14 mmol of HF (in an aqueous solution) in trioctylamine (TOA, a carrier solvent) is quickly injected.

After the completion of the reaction, the resulting mixture is rapidly cooled to room temperature and acetone is added thereto to produce nanocrystal particles, which are then separated by centrifugation and dispersed again in toluene.

The total used amount of S and Se are 0.16 mmol and 2.8 mmol, respectively.

From the XPS analysis made by using the same apparatus set forth in the original specification, it is confirmed that the resulting semiconductor nanocrystal particle includes fluorine.

Comparative Example 5: InZnP Core/Multilayered Shell

A semiconductor nanocrystal including an InZnP core and a multi-layered shell without using fluorine is prepared in the same manner as in Example 7, except for omitting the injection of the HF solution.

From the XPS analysis made by using the same apparatus set forth in the original specification, it is confirmed that the resulting semiconductor nanocrystal particle does not include fluorine.

Evaluation VII: Photoluminescent Analysis of the Core-Shell Semiconductor Nanocrystals A photoluminescence spectrum is obtained using a spectrometer (manufactured by Hitachi Co., Ltd., model name F-7000) for the core-multilayered shell semiconductor nanocrystal with the fluorine doping of Example 8 and the core-multilayered shell semiconductor nanocrystal of Comparative Example 5. The results are summarized in the Table 1. In Table 1, Full-Width-at-Half-Maximum is abbreviated "FWHM," and Quantum Yield is abbreviated "QY."

TABLE 1

|  | Photoluminescent properties | | |
| --- | --- | --- | --- |
|  | Peak Wavelength | FWHM | QY |
| Example 7 | ~530 nm | 41 nm | 68% |
| Comparative Example 5 | ~520 nm | 54 nm | 37% |

The nanocrystal of Example 7, which was identical to the nanocrystal of Comparative Example 5, with the exception that the nanocrystal of Example 7 included fluorine doping, provided a 79% improvement in quantum yield (37% to 68%) and a 13 nm improvement in FWHM, a 24% improvement.

Reference Example 2: Preparation of ZnSe Core

Selenium is dispersed in trioctylphosphine (TOP) to obtain a 2 M Se/TOP stock solution.

10 mL of trioctylamine is added to a reactor along with 0.125 mmol of zinc acetate, 0.25 mmol of palmitic acid, and 0.25 mmol of hexadecyl amine and the mixture is heated under a vacuum at 120° C. In one hour, an atmosphere in the reactor is converted into nitrogen.

After being heated at about 300° C., the prepared Se/TOP stock solution is rapidly added to conduct a reaction. After 60 minutes, the reacted solution is cooled to room temperature and acetone is added thereto to make a precipitate, which is then centrifugation and dispersed in toluene.

UV-vis spectroscopy analysis and photoluminescence spectroscopy analysis of the obtained ZnSe semiconductor nanocrystal are performed. The results confirm that the obtained semiconductor nanocrystal has a first absorption maximum wavelength of about 400 nm and a maximum peak emission wavelength of about 420 nm.

Reference Example 3: Preparation of ZnSeTe Core

A ZnSeTe core is prepared in substantially the same manner as set forth in Reference Example 2 except that tellurium is dispersed in trioctylphosphine (TOP) to obtain 0.1 M Te/TOP stock solution and the Se/TOP stock solution and the Te/TOP stock solution are rapidly added at a Te/Se ratio of 1/25.

UV-vis spectroscopy analysis and photoluminescence spectroscopy analysis of the obtained ZnSeTe semiconductor nanocrystal are performed. The results confirm that the obtained semiconductor nanocrystal has a first absorption maximum wavelength of about 420 nm and a maximum peak emission wavelength of about 460 nm.

Example 8: a Multi-Layered Shell Formation on the ZnSe Core with Using Fluorine 1.8 mmoL of zinc acetate, 3.6 mmol of oleic acid, and 10 mL of trioctylamine are added to a flask and vacuum-treated at 120° C. for 10 minutes. The inside of the flask is substituted with nitrogen (N₂) and then a temperature is increased to 180° C. The ZnSe core prepared in Reference Example 2 is quickly added thereto. Then, at a temperature of about 320° C., a predetermined amount of S/TOP and a predetermined amount of Se/TOP are added several times at a predetermined time interval (each time with a varying ratio between the S/TOP and Se/TOP) to form a multi-layered shell including Zn, Se, and S, each layer having a different composition. During the shell formation, 0.14 mmol of HF (in an aqueous solution) in trioctylamine (TOA, a carrier solvent) is quickly injected.

After the completion of the reaction, the resulting mixture is rapidly cooled to room temperature and acetone is added thereto to produce nanocrystal particles, which are then separated by centrifugation and dispersed again in toluene.

The total used amount of S and Se are about 1.0 mmol and about 0.3 mmol, respectively.

From the photoluminescence analysis result, it is confirmed that the produced quantum dot has a maximum light emitting peak of 443 nm and quantum efficiency of over 60%.

Comparative Example 6: A Multi-Layered Shell Formation on the ZnSe Core without Using Fluorine A multi-layered core/shell nanocrystal particle is prepared in substantially the same manner as set forth in Example 8 except for not using the HF.

From the photoluminescence analysis result, it is confirmed that the produced quantum dot without fluorine in the shell has a similar maximum light emitting peak wavelength but its quantum efficiency is significantly lower than that of the Core/Shell nanocrystal particle of Example 8.

Example 9: a Multi-Layered Shell Formation on the ZnTeSe Core with Using Fluorine 1.8 mmoL of zinc acetate, 3.6 mmol of oleic acid, and 10 mL of trioctylamine are added to a flask and vacuum-treated at 120° C. for 10 minutes. The inside of the flask is substituted with nitrogen (N₂) and then a temperature is increased to 180° C. The ZnTeSe core prepared in Reference Example 3 is quickly added thereto. Then, at a temperature of about 320° C., a predetermined amount of S/TOP and a predetermined amount of Se/TOP are added several times at a predetermined time interval (each time with a varying ratio between the S/TOP and Se/TOP) to form a multi-layered shell including Zn, Se, and S, each layer having a different composition. During the shell formation, 0.14 mmol of HF (in an aqueous solution) in trioctylamine (TOA, a carrier solvent) is quickly injected.

After the completion of the reaction, the resulting mixture is rapidly cooled to room temperature and acetone is added thereto to produce nanocrystal particles, which are then separated by centrifugation and dispersed again in toluene.

The total used amount of S and Se are 0.6 mmol and 0.08 mmol, respectively.

Figure 12:
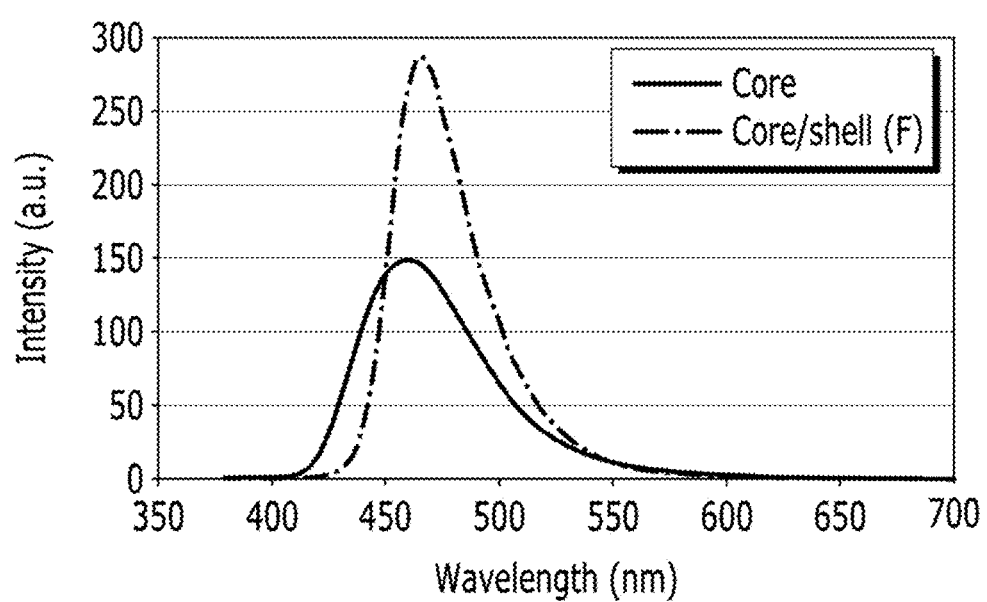
FIG. 12 is a graph of intensity (arbitrary units, a.u.) versus wavelength (nanometers, nm) showing photoluminescence (PL) spectra of the nanocrystal particles prepared in Example 9 and Reference Example 3.

The results of the photoluminescence analysis are shown in FIG. 12.

From the photoluminescence analysis result, it is confirmed that the produced quantum dot has a maximum light emitting peak of 465 nm with a FWHM of 42 nm and quantum efficiency of 55%.

Figure 13:
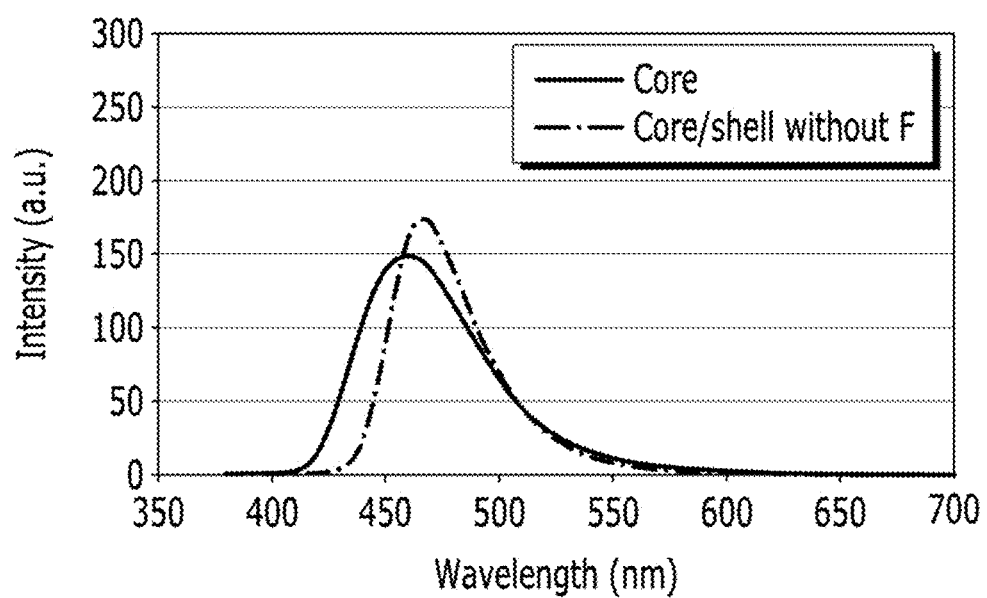
FIG. 13 is a graph of intensity (arbitrary units, a.u.) versus wavelength (nanometers, nm) showing photoluminescence (PL) spectra of the nanocrystal particles prepared in Comparative Example 7 and Reference Example 3.

Comparative Example 7: A Multi-Layered Shell Formation on the ZnTeSe Core without Using Fluorine A core/shell nanocrystal particle is prepared in substantially the same manner as set forth in Example 9 except for not using the HF. The results of the photoluminescence analysis are shown in FIG. 13.

From the photoluminescence analysis result, it is confirmed that the produced quantum dot without fluorine in the shell has a maximum light emitting peak of 466 nm with a FWHM of 44 nm and quantum efficiency of about 34%.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A nanocrystal particle comprising at least one semiconductor material and at least one halogen element,
   wherein the nanocrystal particle has a core-shell structure including a core comprising a first semiconductor nanocrystal; and
   a shell surrounding the core and comprising a crystalline semiconductor material, and
   wherein the at least one halogen element is present as being doped therein or as a metal halide,
   wherein the at least one halogen element comprises fluorine,
   wherein the first semiconductor nanocrystal of the core comprises a zinc telluride, a zinc selenide telluride, or a Group III-V compound comprising indium and phosphorus, and
   the crystalline semiconductor material of the shell comprises ZnSe, ZnS, ZnSeS, or a combination thereof,
   wherein the nanocrystal particle has a quantum yield of greater than or equal to about 50%,
   wherein the nanocrystal particle has a full width at half maximum of less than 50 nm, and
   wherein the nanocrystal particle does not include cadmium.

2. The nanocrystal particle of claim 1, wherein the first semiconductor nanocrystal of the core comprises the zinc selenide telluride.

3. The nanocrystal particle of claim 2, wherein the first semiconductor nanocrystal of the core, the crystalline semiconductor material of the shell, or both comprises zinc.

4. The nanocrystal particle of claim 2, wherein the first semiconductor nanocrystal of the core comprises a ZnTeSe or an indium phosphide.

5. The nanocrystal particle of claim 2, wherein the nanocrystal particle has a quantum yield of greater than or equal to 85%.

6. The nanocrystal particle of claim 2, wherein the fluorine is present at an interface of the core and the shell, in the shell, or at an interface of the core and the shell and in the shell.

7. The nanocrystal particle of claim 2, wherein the nanocrystal particle comprises a bond between zinc and the fluorine.

8. The nanocrystal particle of claim 7, wherein the nanocrystal particle comprises a Zn—F bond, as determined by time-of-flight secondary-ion mass spectrometry.

9. The nanocrystal particle of claim 1, wherein the shell is a multi-layered shell comprising an inner shell, an outer shell on the inner shell, a first interface between the core and the inner shell, and a second interface between the inner shell and the outer shell, each comprising a composition different from one another and wherein each is independently crystalline or amorphous, and wherein the halogen element is included in a region selected from the inner shell, the outer shell, the first interface, and the second interface, or a combination thereof.

10. The nanocrystal particle of claim 2, wherein the at least one halogen element is included in an amount of greater than or equal to about 0.05 mole percent, based on the molar amount of the metal included in the core of the nanoparticle.

11. The nanocrystal particle of claim 2, wherein the shell comprises a material having a bandgap which is larger than a bandgap of the first semiconductor nanocrystal.

12. The nanocrystal particle of claim 2, wherein the nanoparticle further comprises a ligand compound coordinating a surface of the nanocrystal particle.

13. The nanocrystal particle of claim 12, wherein the ligand compound comprises a compound represented by RCOOH, RNH$_2$, R$_2$NH, R$_3$N, RSH, R$_3$PO, R$_3$P, ROH, RCOOR', RPO(OH)$_2$, or R$_2$P(O)OH, or a combination thereof, wherein R and R' are each independently selected from a C1 to C24 alkyl group, a C2 to C24 alkenyl group, and a C6 to C20 aryl group.

14. A process for synthesizing a nanocrystal particle of claim 1, the process comprising:
obtaining a first mixture including a first precursor comprising the second metal, a ligand compound, and a solvent;
heating the first mixture;
contacting a source of fluorine, a second precursor, and the core comprising the first semiconductor nanocrystal with the first mixture, which is heated, to obtain a second mixture; and
heating the second mixture to a reaction temperature to react the first precursor and the second precursor to obtain a nanocrystal particle comprising a semiconductor material and the fluorine,
wherein the source of the halogen element comprises HF, NH$_4$F, HBF$_4$, an ionic liquid including a halogen, or a combination thereof.

15. The process of synthesizing a nanocrystal particle of claim 14, wherein the first precursor comprising the second metal is in a form of an elemental metal, an alkylated metal compound, a metal alkoxide, a metal carboxylate, a metal nitrate, a metal perchlorate, a metal sulfate, a metal acetylacetonate, a metal halide, a metal cyanide, a metal hydroxide, a metal oxide, a metal peroxide, or a combination thereof,
wherein the second precursor comprises a Group VI element comprising sulfur, selenium, or tellurium, a compound comprising the Group VI element, or a combination thereof.

16. The process of synthesizing a nanoparticle of claim 14, wherein contacting the source of the halogen element with the first mixture comprises dissolving the source of the halogen element in a carrier solvent to obtain a solution and adding the solution to the first mixture, and
wherein the carrier solvent is selected from water, a ketone, a primary amine, a secondary amine, a tertiary amine, a heterocyclic compound having a nitrogen atom, a C6 to C40 olefin, a C6 to C40 aliphatic hydrocarbon, a C6 to C30 aromatic hydrocarbon substituted with a C1 to C20 alkyl group, a primary, secondary, or tertiary phosphine substituted with a C6 to C22 alkyl group, a primary, secondary, or tertiary phosphine oxide substituted with a C6 to C22 alkyl group, an aromatic ether, an aromatic alcohol, or a combination thereof.

17. A device including the nanocrystal particle of claim 1.

18. The device of claim 17, wherein the device is a light emitting diode, an organic light emitting diode, a sensor, a solar cell, an imaging sensor, or a liquid crystal display.

19. The nanocrystal particle of claim 1, wherein the nanocrystal particle has a quantum yield of greater than or equal to about 60%, and wherein the nanocrystal particle has a full width at half maximum of less than or equal to 40 nm.

20. A halogen doped core-shell nanocrystal particle comprising at least one halogen element,
wherein the core-shell nanocrystal particle comprises a core comprising a first semiconductor nanocrystal; and a crystalline semiconductor nanocrystal shell surrounding the core,
wherein the at least one halogen element comprises fluorine,
wherein the first semiconductor nanocrystal of the core comprises ZnTeSe, and
the crystalline semiconductor nanocrystal shell comprises ZnSe, ZnS, ZnSeS, or a combination thereof,
wherein the halogen doped core-shell nanocrystal particle has a quantum yield of greater than or equal to about 50%,
wherein the halogen doped core-shell nanocrystal particle has a full width at half maximum of less than 50 nm, and
wherein the halogen doped core-shell nanocrystal particle does not include cadmium.

21. A nanocrystal particle, comprising:
a first semiconductor nanocrystal,
wherein the first semiconductor nanocrystal comprises an indium phosphide or a zinc selenide telluride,
wherein the nanocrystal particle further comprises ZnSe (F), ZnS(F), ZnSeS(F), or a combination thereof, and
wherein the nanocrystal particle has a quantum yield of greater than or equal to about 50%,
wherein the nanocrystal particle has a full width at half maximum of less than 50 nm, and
wherein the nanocrystal particle does not include cadmium.

* * * * *